United States Patent
Kim

(10) Patent No.: US 11,145,357 B2
(45) Date of Patent: Oct. 12, 2021

(54) MEMORY SYSTEM, MEMORY CONTROLLER AND METHOD FOR OPERATING MEMORY SYSTEM

(71) Applicant: SK hynix Inc., Gyeonggi-do (KR)

(72) Inventor: Su-Kyung Kim, Seoul (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/796,553

(22) Filed: Feb. 20, 2020

(65) Prior Publication Data

US 2021/0005242 A1    Jan. 7, 2021

(30) Foreign Application Priority Data

Jul. 2, 2019 (KR) .......... 10-2019-0079065

(51) Int. Cl.
*G11C 16/06* (2006.01)
*G11C 11/408* (2006.01)
*G11C 11/4074* (2006.01)
*H03M 13/11* (2006.01)
*G11C 11/56* (2006.01)
*G06F 13/16* (2006.01)
*G11C 11/409* (2006.01)

(52) U.S. Cl.
CPC ...... *G11C 11/4087* (2013.01); *G06F 13/1668* (2013.01); *G11C 11/409* (2013.01); *G11C 11/4074* (2013.01); *G11C 11/5642* (2013.01); *H03M 13/1111* (2013.01)

(58) Field of Classification Search
CPC .................................................. H03M 13/1111
USPC ..................................................... 365/185.09
See application file for complete search history.

(56) References Cited

U.S. PATENT DOCUMENTS

| | | | |
|---|---|---|---|
| 2011/0083060 A1* | 4/2011 | Sakurada | G11C 16/26 714/763 |
| 2016/0269046 A1* | 9/2016 | Watanabe | H03M 13/2963 |
| 2019/0108092 A1* | 4/2019 | Lee | G06F 11/1012 |

FOREIGN PATENT DOCUMENTS

| | | |
|---|---|---|
| KR | 10-2017-0039795 | 4/2017 |
| KR | 10-2018-0106469 | 10/2018 |

* cited by examiner

*Primary Examiner* — Hoai V Ho
(74) *Attorney, Agent, or Firm* — IP & T Group LLP

(57) ABSTRACT

A memory system, a memory controller and a method for operating a memory system are disclosed. Specifically, by performing soft-decision decoding for data read from some of the plurality of memory cells based on a first optimum read voltage of one or more optimum read voltages, based on reliability values of one or more first threshold voltage sections, and one or more second threshold voltage sections and also based on the first and second threshold voltage sections, it is possible to provide a memory system, a memory controller and a method for operating a memory system, capable of increasing an error correction effect by soft-decision decoding even in the case where threshold voltage distributions of memory cells in which data is stored are degraded.

20 Claims, 18 Drawing Sheets

MEMORY SYSTEM, MEMORY CONTROLLER AND METHOD FOR OPERATING MEMORY SYSTEM

CROSS-REFERENCE TO RELATED APPLICATION

The present application claims priority under 35 U.S.C. 119(a) to Korean Patent Application No. 10-2019-0079065, filed in the Korean Intellectual Property Office on Jul. 2, 2019, which is incorporated herein by reference in its entirety.

BACKGROUND

1. Technical Field

Various embodiments generally relate to a memory system, a memory controller and a method for operating a memory system.

2. Related Art

A memory system stores data based on a request of a host, such as a computer, a mobile terminal such as a smartphone and a tablet, or various other electronic devices. The memory system may include a device which stores data in a magnetic disk, such as a hard disk drive (HDD), or a device which stores data in a nonvolatile memory, such as a solid state drive (SDD), a universal flash storage (UFS) device or an embedded MMC (eMMC) device.

The memory system may further include a memory controller for controlling a memory device of the system. The memory controller may receive a command from the host, and may perform or control an operation for reading, writing or erasing data with respect to a volatile memory or a nonvolatile memory in the memory system, based on the received command.

If a read fail occurs in the process of reading data in a memory system, a soft-decision decoding operation may be performed for error correction. In this regard, if the threshold voltage distributions of memory cells in which data is stored are degraded due to various factors, the efficacy of soft-decision decoding is likely to be decreased. Therefore, there is a need for a method of performing soft-decision decoding so as to increase the accuracy and reliability of error correction even when threshold voltage distributions are degraded.

SUMMARY

Various embodiments are directed to a memory system, a memory controller and a method for operating a memory system, capable of increasing an error correction effect by soft-decision decoding even in the case where threshold voltage distributions of memory cells in which data is stored are degraded.

In one aspect, embodiments of the disclosure may provide a memory system including: a memory device including a plurality of memory cells; and a memory controller configured to control the memory device.

The memory controller may be configured to perform soft-decision decoding for data read from some of the plurality of memory cells based on a first optimum read voltage of one or more optimum read voltages.

The memory controller may perform soft-decision decoding based on reliability values of one or more first threshold voltage sections, and one or more second threshold voltage sections and also based on the first and second threshold voltage sections.

The one or more first threshold voltage sections may be determined by read voltages, which are lower than the first optimum read voltage, and the one or more second threshold voltage sections may be determined by read voltages, which are higher than the first optimum read voltage.

The memory controller may be configured to determine a size of the one or more first threshold voltage sections to be different than a size of the one or more second threshold voltage sections.

Size of each of the first threshold voltage sections may be the same, and size of each of the second threshold voltage sections may be the same.

When the first optimum read voltage is a lowest of the one or more optimum read voltages, the memory controller may determine the size of each of the first threshold voltage sections and the size of each of the second threshold voltage sections based on the first optimum read voltage and a second optimum read voltage.

The second optimum read voltage may have a minimum difference from the first optimum read voltage among the one or more optimum read voltages.

When the first optimum read voltage is a highest of the one or more optimum read voltages, the memory controller may determine the size of each of the first threshold voltage sections and the size of each of the second threshold voltage sections, by comparing the number of memory cells having threshold voltages in a first sampling threshold voltage section and the number of memory cells having threshold voltages in a second sampling threshold voltage section.

The first sampling threshold voltage section may be determined by the first optimum read voltage and a read voltage lower by K than the first optimum read voltage and the second sampling threshold voltage section may be determined by the first optimum read voltage and a read voltage higher by K than the first optimum read voltage.

In the case where at least one optimum read voltage lower than the first optimum read voltage and at least one optimum read voltage higher than the first optimum read voltage exist among the one or more optimum read voltages, the memory controller may determine the size of the first threshold voltage sections and the size of the second threshold voltage sections, by comparing an offset between the first optimum read voltage and a third optimum read voltage and comparing an offset between the first optimum read voltage and a fourth optimum read voltage.

The third optimum read voltage may be a highest of optimum read voltages lower than the first optimum read voltage among the one or more optimum read voltages. The fourth optimum read voltage may be a lowest of optimum read voltages higher than the first optimum read voltage among the one or more optimum read voltages.

The memory controller may determine the size of each of the first threshold voltage sections and the size of each of the second threshold voltage sections, by comparing an offset between the first optimum read voltage and an average threshold voltage of a first threshold voltage distribution and an offset between the first optimum read voltage and an average threshold voltage of a second threshold voltage distribution. The first threshold voltage distribution and the second threshold voltage distribution are adjacent to the first optimum read voltage.

The average threshold voltage of the second threshold voltage distribution may be higher than the average threshold voltage of the first threshold voltage distribution.

In another aspect, embodiments of the disclosure may provide a memory controller including: a memory interface configured to communicate with a memory device including a plurality of memory cells and a control circuit configured to control the memory device.

The control circuit may be configured to perform soft-decision decoding for data read from some among the plurality of memory cells based on a first optimum read voltage which is one among one or more optimum read voltages.

The control circuit may perform soft-decision decoding based on reliability values of one or more first threshold voltage sections, and one or more second threshold voltage sections and also based on the first and second threshold voltage sections.

The one or more first threshold voltage sections may be determined by read voltages, which are lower than the first optimum read voltage, and the one or more second threshold voltage sections may be determined by read voltages, which are higher than the first optimum read voltage.

The control circuit may be configured to determine a size of the one or more first threshold voltage sections to be different from a size of the one or more second threshold voltage sections.

The size of each of the first threshold voltage sections may be the same, and the size of each of the second threshold voltage sections may be the same.

When the first optimum read voltage is a lowest of the one or more optimum read voltages, the control circuit may determine the size of each of the first threshold voltage sections and the size of each of the second threshold voltage sections based on the first optimum read voltage and a second optimum read voltage.

The second optimum read voltage may be an optimum read voltage having a minimum difference from the first optimum read voltage among the one or more optimum read voltages.

When the first optimum read voltage is a highest of the one or more optimum read voltages, the control circuit may determine the size of each of the first threshold voltage sections and the size of each of the second threshold voltage sections, by comparing the number of memory cells corresponding to a first sampling threshold voltage section and the number of memory cells corresponding to a second sampling threshold voltage section.

The first sampling threshold voltage section may be determined by the first optimum read voltage and a read voltage lower by K than the first optimum read voltage, and the second sampling threshold voltage section may be determined by the first optimum read voltage and a read voltage higher by K than the first optimum read voltage.

In the case where at least one optimum read voltage lower than the first optimum read voltage and at least one optimum read voltage higher than the first optimum read voltage exist among the one or more optimum read voltages, the control circuit may determine the size of each of the first threshold voltage sections and the size of each of the second threshold voltage sections, by comparing an offset between the first optimum read voltage and a third optimum read voltage and comparing an offset between the first optimum read voltage and a fourth optimum read voltage.

The third optimum read voltage may be a highest of optimum read voltages lower than the first optimum read voltage among the one or more optimum read voltages. The fourth optimum read voltage may be a lowest of optimum read voltages higher than the first optimum read voltage among the one or more optimum read voltages.

In still another aspect, embodiments of the disclosure may provide a method for operating a memory system including a memory device including a plurality of memory cells and a memory controller configured to control the memory device.

The method for operating a memory system may include reading data from some among the plurality of memory cells based on a first optimum read voltage which is one among one or more optimum read voltages.

The method for operating a memory system may include performing soft-decision decoding, based on reliability values of one or more first threshold voltage sections and one or more second threshold voltage sections and also based on the first and second threshold voltage sections.

The one or more first threshold voltage sections may be determined by read voltages, which are lower than the first optimum read voltage, and the one or more second threshold voltage sections may be determined by read voltages, which are higher than the first optimum read voltage.

A size of the one or more first threshold voltage sections may be determined to be different than a size of the one or more second threshold voltage sections.

The size of each of the first threshold voltage sections may be the same, and the size of each of the second threshold voltage sections may be the same.

In the performing of the soft-decision decoding, when the first optimum read voltage is a lowest of the one or more optimum read voltages, the size of each of the first threshold voltage sections and the size of each of the second threshold voltage sections may be determined based on the first optimum read voltage and a second optimum read voltage.

The second optimum read voltage may be an optimum read voltage having a minimum difference from the first optimum read voltage among the one or more optimum read voltages.

In the performing of the soft-decision decoding, when the first optimum read voltage is a highest of the one or more optimum read voltages, the size of each of the first threshold voltage sections and the size of each of the second threshold voltage sections may be determined by comparing the number of memory cells corresponding to a first sampling threshold voltage section and the number of memory cells corresponding to a second sampling threshold voltage section.

The first sampling threshold voltage section may be determined by the first optimum read voltage and a read voltage lower by K than the first optimum read voltage, and the second sampling threshold voltage section may be determined by the first optimum read voltage and a read voltage higher by K than the first optimum read voltage.

In the performing of the soft-decision decoding, in the case where at least one optimum read voltage lower than the first optimum read voltage and at least one optimum read voltage higher than the first optimum read voltage exist among the one or more optimum read voltages, the size of each of the first threshold voltage sections and the size of each of the second threshold voltage sections may be determined by comparing an offset between the first optimum read voltage and a third optimum read voltage and an offset between the first optimum read voltage and a fourth optimum read voltage.

The third optimum read voltage may be a highest of optimum read voltages lower than the first optimum read voltage among the one or more optimum read voltages. The fourth optimum read voltage may be a lowest of optimum read voltages higher than the first optimum read voltage among the one or more optimum read voltages.

In still another aspect, embodiments of the disclosure may provide a method of a controller for controlling a memory device.

The operating method may include reading data from the memory device with a selected hard decision (HD) read voltage and first and second groups of soft decision (SD) read voltages corresponding to the selected HD read voltage.

The operating method may include performing a soft decision error correction operation on the read data based on a log likelihood ratio (LLR) of the first and second groups.

The first and second groups may have lower and higher voltage levels than the selected HD read voltage, respectively.

The reading may include changing read voltage intervals within each of the first and second groups based on two intervals formed by the selected HD read voltage and lower and higher HD read voltages neighboring the selected HD read voltage.

In still another aspect, embodiments of the disclosure may provide a method of a controller for controlling a memory device.

The operating method may include reading data from the memory device with a selected hard decision (HD) read voltage and first and second groups of soft decision (SD) read voltages corresponding to the selected HD read voltage.

The operating method may perform a soft decision error correction operation on the read data based on a log likelihood ratio (LLR) of the first and second groups.

The first and second groups may have lower and higher voltage levels than the selected HD read voltage, respectively.

The reading may include changing read voltage intervals within each of the first and second groups based on two intervals formed by the selected HD read voltage and lower and higher sampling read voltages neighboring the selected HD read voltage.

In still another aspect, embodiments of the disclosure may provide a method of a controller for controlling a memory device.

The operating method may include reading data from the memory device with a selected hard decision (HD) read voltage and first and second groups of soft decision (SD) read voltages corresponding to the selected HD read voltage.

The operating method may include performing a soft decision error correction operation on the read data based on a log likelihood ratio (LLR) of the first and second groups.

The first and second groups may have lower and higher voltage levels than the selected HD read voltage, respectively.

The reading may include changing read voltage intervals within each of the first and second groups based on a reference voltage interval and an interval formed by the selected HD read voltage and a higher HD read voltage neighboring the selected HD read voltage.

According to the embodiments of the disclosure, it is possible to provide a memory system, a memory controller and a method for operating a memory system, capable of increasing an error correction effect by soft-decision decoding even in the case where threshold voltage distributions of memory cells in which data is stored are degraded.

DETAILED DESCRIPTION

A memory system, a memory controller and a method for operating a memory system are described below in detail with reference to the accompanying drawings through various examples of embodiments of the disclosure. Throughout the specification, reference to "an embodiment," "another embodiment" or the like is not necessarily to only one embodiment, and different references to any such phrase are not necessarily to the same embodiment(s).

Figure 1:
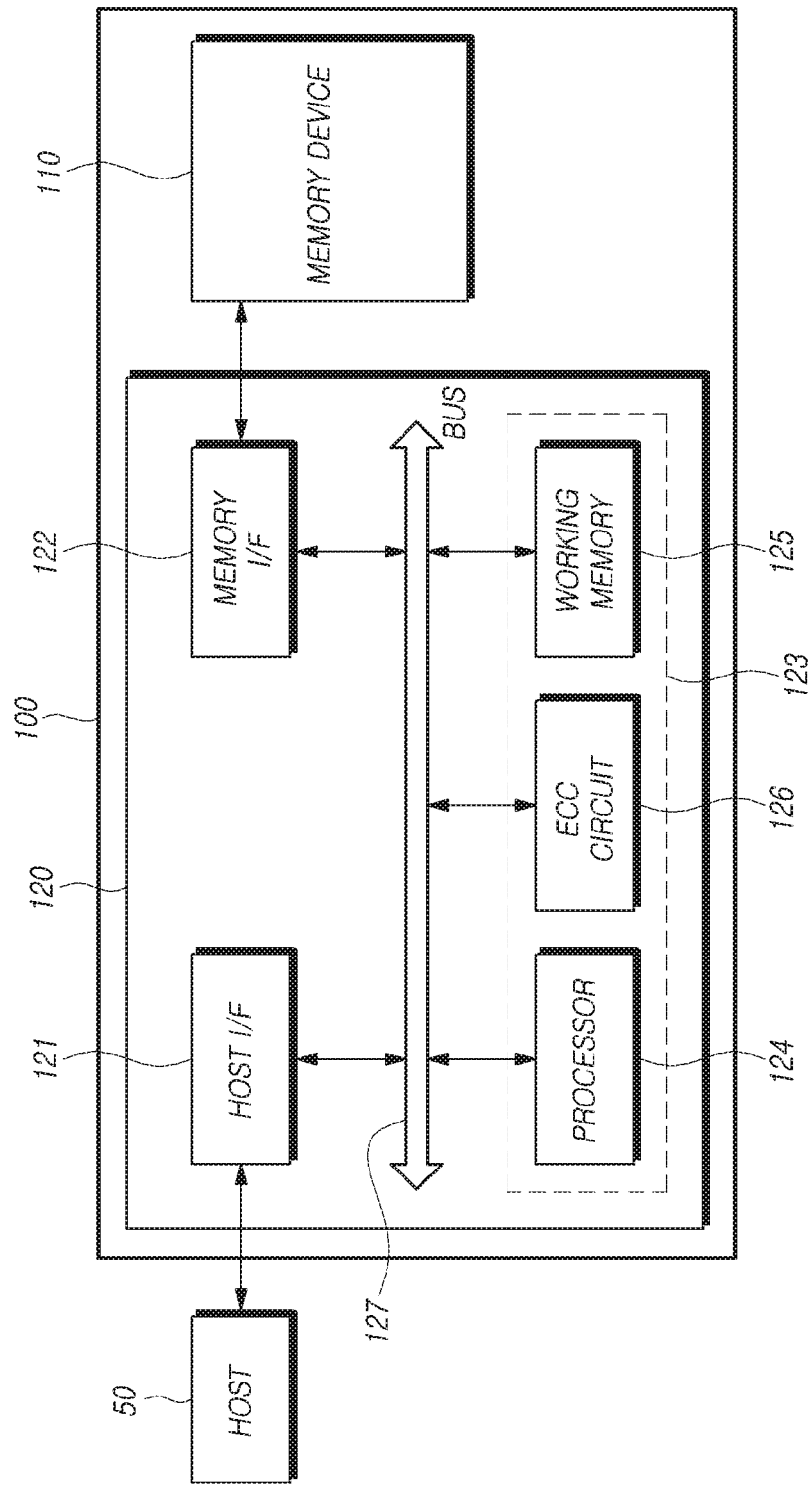
FIG. 1 is a block diagram schematically illustrating a memory system in accordance with an embodiment of the disclosure.

FIG. 1 is a block diagram schematically illustrating a representation of an example of a memory system 100 in accordance with an embodiment of the disclosure.

Referring to FIG. 1, the memory system 100 may include a memory device 110 which stores data, and a memory controller 120 which controls the memory device 110.

The memory device 110 includes a plurality of memory blocks and operates in response to the control of the memory controller 120. Operations of the memory device 110 may include, for example, a read operation, a program operation (also referred to as a write operation) and an erase operation.

The memory device 110 may include a memory cell array including a plurality of memory cells which store data. Such a memory cell array may exist in memory blocks.

For example, the memory device 110 may be realized by a DDR SDRAM (double data rate synchronous dynamic random access memory), an LPDDR4 (low power double data rate 4) SDRAM, a GDDR (graphics double data rate) SDRAM, an LPDDR (low power DDR), an RDRAM (Rambus dynamic random access memory), a NAND flash memory, a vertical NAND flash memory, a NOR flash memory, a resistive random access memory (RRAM), a phase-change memory (PRAM), a magnetoresistive random access memory (MRAM), a ferroelectric random access memory (FRAM) or a spin transfer torque random access memory (STT-RAM).

The memory device 110 may be realized in a three-dimensional array structure. The embodiments of the disclosure may be applied to not only a flash memory device in which a charge storage layer is configured by a conductive floating gate but also a charge trap flash (CTF) in which a charge storage layer is configured by a dielectric layer.

The memory device 110 is configured to receive a command and an address from the memory controller 120 and access a region in the memory cell array which is selected by the address. In other words, the memory device 110 may perform an operation corresponding to the command, for a region selected by the address.

For example, the memory device 110 may perform a program operation, a read operation and an erase operation. In this connection, in the program operation, the memory device 110 may program data in a region selected by the address. In the read operation, the memory device 110 may read data from a region selected by the address. In the erase operation, the memory device 110 may erase data stored in a region selected by the address.

The memory controller 120 may control the operation of the memory device 110 according to a request of a host 50 or regardless of a request of the host 50.

For example, the memory controller 120 may control write (program), read, erase and background operations for the memory device 110. For example, the background operation may be a garbage collection (GC) operation, a wear leveling (WL) operation, a bad block management (BBM) operation, or the like.

Referring to FIG. 1, the memory controller 120 may include a host interface 121, a memory interface 122, and a control circuit 123.

The host interface 121 provides an interface for communication with the host 50. When receiving a command from the host 50, the control circuit 123 may receive the command through the host interface 121, and then, may perform an operation of processing the received command.

The memory interface 122 is coupled with the memory device 110 and thereby provides an interface for communication with the memory device 110. That is to say, the memory interface 122 may be configured to provide the interface between the memory device 110 and the memory controller 120 in response to the control of the control circuit 123.

The control circuit 123 performs the general control operations of the memory controller 120, thereby controlling the operations of the memory device 110. To this end, for instance, the control circuit 123 may include at least one of a processor 124 and a working memory 125, and may further include an error detection and correction circuit (ECC circuit) 126.

The processor 124 may control general operations of the memory controller 120, and may perform a logic calculation. The processor 124 may communicate with the host 50 through the host interface 121, and may communicate with the memory device 110 through the memory interface 122.

The processor 124 may perform the function of a flash translation layer (FTL). The processor 124 may translate a logical block address (LBA) provided by the host, into a physical block address (PBA), through the flash translation layer (FTL). The flash translation layer (FTL) may receive the logical block address (LBA) and translate the received logical block address (LBA) into the physical block address (PBA), by using a mapping table. There are various address mapping methods of the flash translation layer, depending on a mapping unit. Representative address mapping methods include a page mapping method, a block mapping method and a hybrid mapping method.

The processor 124 is configured to randomize data received from the host 50. For example, the processor 124 may randomize data received from the host 50, by using a randomizing seed. Randomized data as data to be stored is provided to the memory device 110 and is programmed to the memory cell array.

The processor 124 is configured to derandomize data received from the memory device 110, in a read operation. For example, the processor 124 may derandomize data received from the memory device 110, by using a derandomizing seed. Derandomized data may be outputted to the host 50.

The processor 124 may control the operation of the memory controller 120 by executing firmware. In other words, in order to control general operations of the memory controller 120 and perform a logic calculation, the processor 124 may execute (drive) firmware loaded to the working memory 125 upon booting. For instance, the firmware may be stored in the memory device 110 and be loaded to the working memory 125.

The firmware as a program executed in the memory system 100 may include, for example, a flash translation layer (FTL) which performs a converting function between a logical address requested to the memory system 100 from the host 50 and a physical address of the memory device 110, a host interface layer (HIL) which serves to analyze a command requested to the memory system 100 as a storage device from the host 50 and transfers the command to the flash translation layer (FTL), and a flash interface layer (FIL) which transfers a command instructed from the flash translation layer (FTL) to the memory device 110.

The working memory 125 may store firmware, program code, a command and data to drive the memory controller 120.

The working memory 125, for example, as a volatile memory, may include at least one among an SRAM (static RAM), a DRAM (dynamic RAM) and an SDRAM (synchronous DRAM).

The error detection and correction circuit 126 may be configured to detect an error bit of data stored in the working memory 125 (that is, read data transferred from the memory device 110) by using an error correction code and correct the detected error bit.

The error detection and correction circuit 126 may be realized to decode data by using an error correction code. The error detection and correction circuit 126 may be realized by various code decoders. For example, a decoder which performs unsystematic code decoding or a decoder which performs systematic code decoding may be used.

For example, the error detection and correction circuit 126 may detect an error bit for each read data, in the unit of sector. Namely, each read data may be constituted by a plurality of sectors. A sector may mean a data unit smaller than a page as a read unit of a flash memory. Sectors constituting each read data may be matched with one another by the medium of an address.

The error detection and correction circuit 126 may calculate a bit error rate (BER), and may determine whether an error is correctable or not, in the unit of sector. For example, in the case where a bit error rate (BER) is higher than a reference value, the error detection and correction circuit 126 may determine that a corresponding sector is uncorrectable or a fail. On the other hand, in the case where a bit error rate (BER) is lower than the reference value, the error detection and correction circuit 126 may determine that a corresponding sector is correctable or a pass.

The error detection and correction circuit 126 may perform an error detection and correction operation sequentially for all read data. In the case where a sector included in read data is correctable, the error detection and correction circuit 126 may omit an error detection and correction operation for a corresponding sector for next read data. If the error detection and correction operation for all read data is ended in this way, the error detection and correction circuit 126 may detect a sector which is determined to be uncorrectable to be the last. There may be one or more sectors that are determined to be uncorrectable. The error detection and correction circuit 126 may transfer information (for example, address information) on a sector which is determined to be uncorrectable, to the processor 124.

A bus 127 may be configured to provide channels among the components 121, 122, 124, 125 and 126 of the memory controller 120. The bus 127 may include, for example, a control bus for transferring various control signals, commands and the like, and a data bus for transferring various data.

The above-described components 121, 122, 124, 125 and 126 of the memory controller 120 are merely examples of components that may be included in the memory controller 120. One or more of these components may be omitted, and some may be combined into a single component. Of course, one or more components may be added.

The memory device 110 is described in further detail with reference to FIG. 2.

Figure 2:
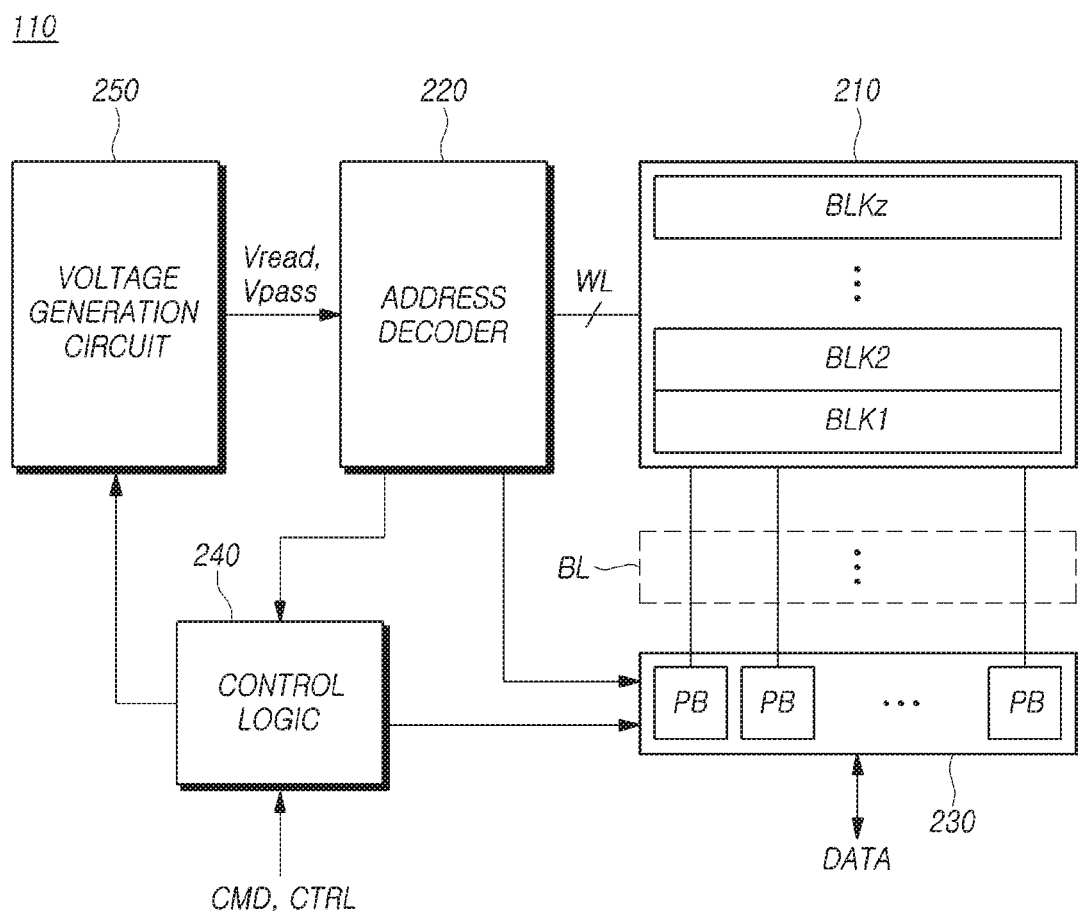
FIG. 2 is a block diagram schematically illustrating a memory device in accordance with an embodiment of the disclosure.

FIG. 2 is a block diagram schematically illustrating the memory device 110 in accordance with an embodiment of the disclosure.

Referring to FIG. 2, the memory device 110 may include a memory cell array 210, an address decoder 220, a read and write circuit 230, control logic 240, and a voltage generation circuit 250.

The memory cell array 210 may include a plurality of memory blocks BLK1 to BLKz (z is a natural number of 2 or greater).

In the plurality of memory blocks BLK1 to BLKz, a plurality of word lines WL and a plurality of bit lines BL may be disposed, and a plurality of memory cells (MC) may be arranged.

The plurality of memory blocks BLK1 to BLKz may be coupled to the address decoder 220 through the plurality of word lines WL. The plurality of memory blocks BLK1 to BLKz may be coupled to the read and write circuit 230 through the plurality of bit lines BL.

Each of the plurality of memory blocks BLK1 to BLKz may include a plurality of memory cells. For example, the plurality of memory cells may be nonvolatile memory cells, and may be configured by nonvolatile memory cells which have vertical channel structures. The memory cell array 210 may be configured by a memory cell array of a two-dimensional structure, or may be configured by a memory cell array of a three-dimensional structure.

Each of the plurality of memory cells in the memory cell array may store at least 1-bit data. For instance, each of the plurality of memory cells may be a single level cell (SLC) storing 1-bit data. For another instance, each of the plurality of memory cells may be a multi-level cell (MLC) which stores 2-bit data. For another instance, each of the plurality of memory cells may be a triple level cell (TLC) which stores 3-bit data. For another instance, each of the plurality of memory cells may be a quad level cell (QLC) which stores 4-bit data. For still yet another instance, the memory cell array 210 may include a plurality of memory cells, each of which stores 5 or more-bit data.

Referring to FIG. 2, the address decoder 220, the read and writhe circuit 230, the control logic 240 and the voltage generation circuit 250 may collectively operate as a peripheral circuit which drives the memory cell array 210.

The address decoder 220 may be coupled to the memory cell array 210 through the plurality of word lines WL. The address decoder 220 may be configured to operate in response to the control of the control logic 240. The address decoder 220 may receive an address through an input/output buffer in the memory device 110.

The address decoder 220 may be configured to decode a block address in the received address. The address decoder 220 may select at least one memory block based on the decoded block address. The address decoder 220 may apply a read voltage Vread generated in the voltage generation circuit 250 to a word line selected in a memory block selected in a read voltage applying operation during a read operation, and may apply a pass voltage Vpass to the remaining unselected word lines. Further, the address decoder 220 may apply a verify voltage generated in the voltage generation circuit 250 to a word line selected in a selected memory block in a program verify operation, and may apply the pass voltage Vpass to the remaining unselected word lines.

The address decoder 220 may be configured to decode a column address in the received address. The address decoder 220 may transmit the decoded column address to the read and write circuit 230.

A read operation and a program operation of the memory device 110 may be performed in the unit of page. An address received when a read operation or a program operation is requested may include a block address, a row address and a column address.

The address decoder 220 may select one memory block and one word line based on a block address and a row address. A column address may be decoded by the address decoder 220 and be provided to the read and write circuit 230.

The address decoder 220 may include at least one among a block decoder, a row decoder, a column decoder and an address buffer.

The read and write circuit 230 may include a plurality of page buffers PB. The read and write circuit 230 may operate as a read circuit in a read operation of the memory cell array 210, and may operate as a write circuit in a write operation of the memory cell array 210.

The read and write circuit 230 described above may include a page buffer circuit or a data register circuit. For example, the data register circuit may include a data buffer for performing a data processing function, and in another embodiment, may further include a cache buffer for performing a caching function.

The plurality of page buffers PB may be coupled to the memory cell array 210 through the plurality of bit lines BL. The plurality of page buffers PB may continuously supply current to bit lines coupled with memory cells to sense the threshold voltages (Vth) of the memory cells in a read operation and a program verify operation, and may latch data by sensing, through nodes, that the amounts of current flowing depending on the programmed states of the corresponding memory cells have changed. The read and write circuit 230 may operate in response to page buffer control signals outputted from the control logic 240.

In a read operation, the read and write circuit 230 temporarily stores read data by sensing data of memory cells, and then, outputs data DATA to the input/output buffer of the memory device 110. As an exemplary embodiment, the read and write circuit 230 may include a column select circuit in addition to the page buffers (or page registers).

The control logic 240 may be coupled with the address decoder 220, the read and write circuit 230 and the voltage generation circuit 250. The control logic 240 may receive a command CMD and a control signal CTRL through the input/output buffer of the memory device 110.

The control logic 240 may be configured to control general operations of the memory device 110 in response to the control signal CTRL. Further, the control logic 240 may output a control signal for adjusting the precharge potential levels of the sensing nodes of the plurality of page buffers PB.

The control logic 240 may control the read and write circuit 230 to perform a read operation of the memory cell array 210.

The voltage generation circuit 250 may generate the read voltage Vread and the pass voltage Vpass in a read operation in response to a voltage generation circuit control signal outputted from the control logic 240.

Figure 3:
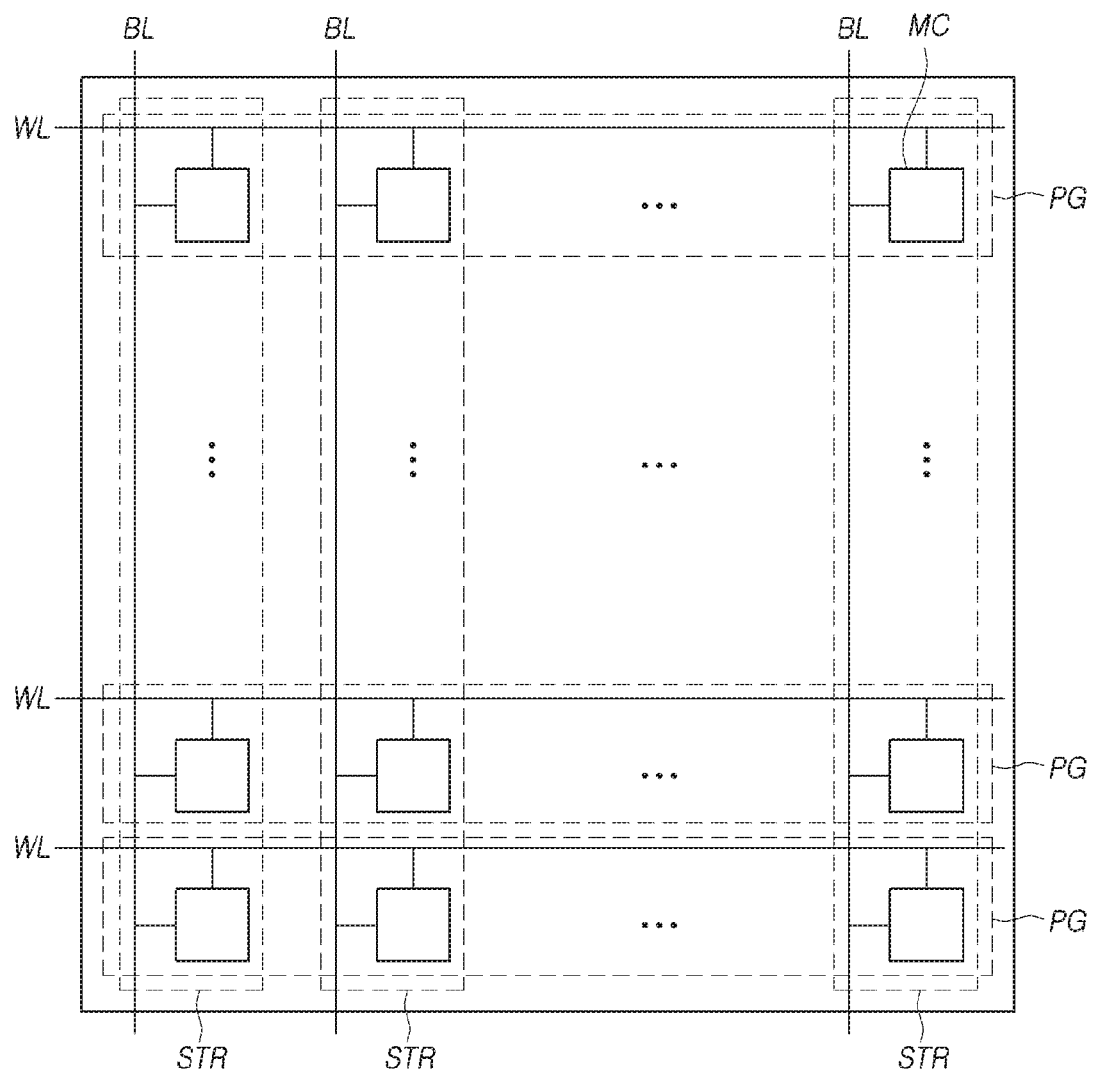
FIG. 3 is a diagram schematically illustrating a memory block of the memory device in accordance with an embodiment of the disclosure.

FIG. 3 is a diagram schematically illustrating a representative one of the plurality of memory blocks BLK1 to BLKz of the memory device 110 in accordance with n embodiment of the disclosure.

Referring to FIG. 3, each of the plurality of memory blocks BLK1 to BLKz in the memory device 110 may be configured as a plurality of pages PG and a plurality of strings STR are disposed in the form of a matrix.

The plurality of pages PG correspond to a plurality of word lines WL, and the plurality of strings STR correspond to a plurality of bit lines BL.

That is to say, in each of the plurality of memory blocks BLK1 to BLKz, the plurality of word lines WL and the plurality of bit lines BL may be disposed in an intersecting arrangement. For example, each of the plurality of word lines WL may be disposed in a row direction, and each of the plurality of bit lines BL may be disposed in a column direction. For another example, each of the plurality of word lines WL may be disposed in a column direction, and each of the plurality of bit lines BL may be disposed in a row direction.

At the intersections of the word lines WL and the bit lines BL a plurality of memory cells MC may be defined. A transistor may be disposed in each memory cell MC. For example, the transistor disposed in each memory cell MC may include a drain, a source and a gate. The drain (or the source) of the transistor may be coupled directly or via one or more other transistors with a corresponding bit line, the source (or the drain) of the transistor may be coupled directly or via one or more other transistors with a source line (which may be the ground), and the gate of the transistor may include a floating gate which is surrounded by a dielectric and a control gate to which a gate voltage is applied.

A read operation and a program operation (write operation) may be performed in the unit of page, and an erase operation may be performed in the unit of memory block.

Referring to FIG. 3, in each of the plurality of memory blocks BLK1 to BLKz, a first select line (also referred to as a source select line or a drain select line) may be additionally disposed outside a first outermost word line more adjacent to the read and write circuit 230, and a second select line (also referred to as a drain select line or a source select line) may be additionally disposed outside a second outermost word line.

At least one dummy word line may be additionally disposed between the first outermost word line and the first select line. At least one dummy word line may also be additionally disposed between the second outermost word line and the second select line.

Embodiments of the disclosure are described using graphs that indicate the number of memory cells for different threshold voltages. In the graphs illustrated in the drawings, the horizontal axis Vth may mean a threshold voltage of a memory cell, and the vertical axis CELL_CNT may mean the number of memory cells with respect to a threshold voltage. Memory cells described below may be some among the plurality of memory cells in the memory device 110.

Further, a case where the number of bits stored per memory cell is 3 is illustrated and described as an example. However, it is to be noted that the present invention is not limited to memory cells that each store 3 bits. If i number of bits are stored per memory cell, $2^i$ number of threshold voltage distributions may be formed per memory cell (e.g., if i=4, 16 threshold voltage distributions may be formed per memory cell).

Figure 4:
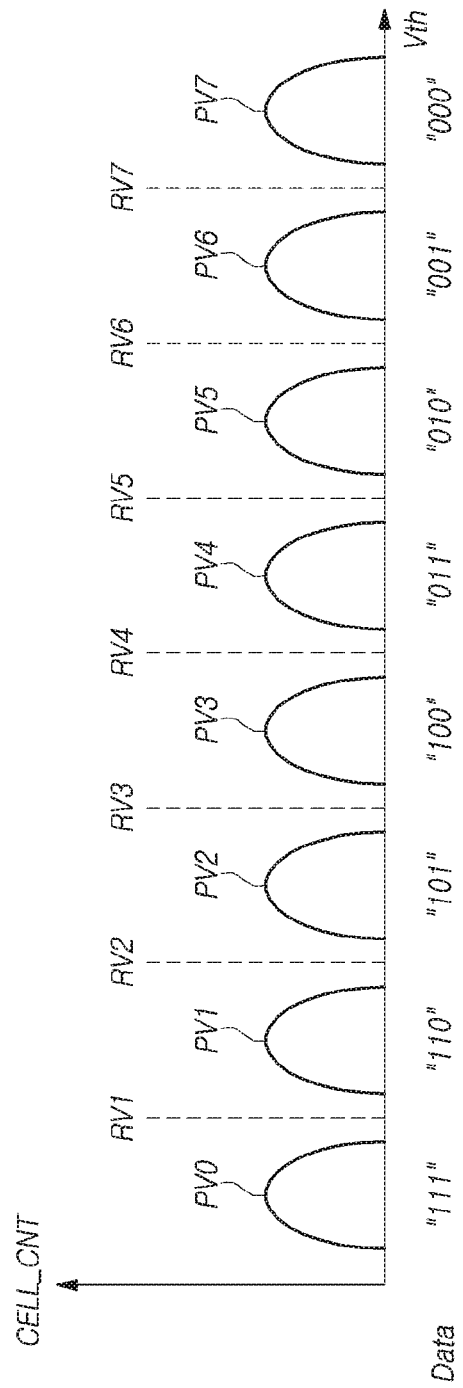
FIG. 4 is a diagram illustrating threshold voltage distributions of memory cells in accordance with an embodiment of the disclosure.

FIG. 4 is a diagram illustrating threshold voltage distributions PV0 to PV7 of memory cells in accordance with an embodiment of the disclosure.

Referring to FIG. 4, memory cells in the memory device 110 may form the threshold voltage distributions PV0 to PV7 depending on data stored therein. For example, memory cells in which data "111" is stored may form the threshold voltage distribution PV0. Memory cells in which data "110" is stored may form the threshold voltage distribution PV1. Memory cells in which data "101" is stored may form the threshold voltage distribution PV2. Memory cells in which data "100" is stored may form the threshold voltage distribution PV3. Memory cells in which data "011" is stored may form the threshold voltage distribution PV4. Memory cells in which data "010" is stored may form the threshold voltage distribution PV5. Memory cells in which data "001" is stored may form the threshold voltage distribution PV6. Lastly, memory cells in which data "000" is stored may form the threshold voltage distribution PV7.

If a read voltage is applied to a memory cell, the memory cell may be turned on or off based on whether the threshold voltage of the memory cell is lower or higher than the applied read voltage. Through this, the memory device 110 may obtain data stored in the memory cell.

The memory device 110 may obtain data stored in a memory cell by applying different read voltages one by one to the memory cell, and may determine a threshold voltage distribution corresponding to the memory cell based on the corresponding data. For instance, if the threshold voltage of a certain memory cell is higher than a read voltage RV3 and lower than a read voltage RV4, a threshold voltage distribution corresponding to the memory cell may be determined as the threshold voltage distribution PV3 that is positioned between the read voltage RV3 and the read voltage RV4.

As illustrated in FIG. 4, if the threshold voltage distributions PV0 to PV7 are clearly distinguished by read voltages RV1 to RV7 when reading data stored in memory cells, an error may not occur when the data stored in the memory cells are read based on the read voltages RV1 to RV7. Therefore, the memory device 110 may program data such that the memory cells form the threshold voltage distributions PV0 to PV7, and then, may read the data based on the read voltages RV1 to RV7. In this case, the occurrence of errors is minimized when reading the data stored in the memory cells.

As such, the read voltages RV1 to RV7, which may minimize the occurrence of errors when reading the data stored in the memory cells, may be referred to as optimum read voltages. The optimum read voltages may also be referred to as optimum read biases, and the meanings thereof are not limited by designations.

In FIG. 4, the respective threshold voltage distributions PV0 to PV7 are clearly distinguished by the read voltages RV1 to RV7. However, due to various factors (e.g., repetition of read operations), threshold voltage distributions may change over time, and there may occur a case where threshold voltage distributions overlap with each other. For instance, a threshold voltage distribution of memory cells in which specific data (e.g., "100") is stored may widen as read operations are repeated, and the range of the threshold voltage distribution that the memory cells in which the corresponding data is stored may be widened. Such a case is described with reference to FIG. 5.

Figure 5:
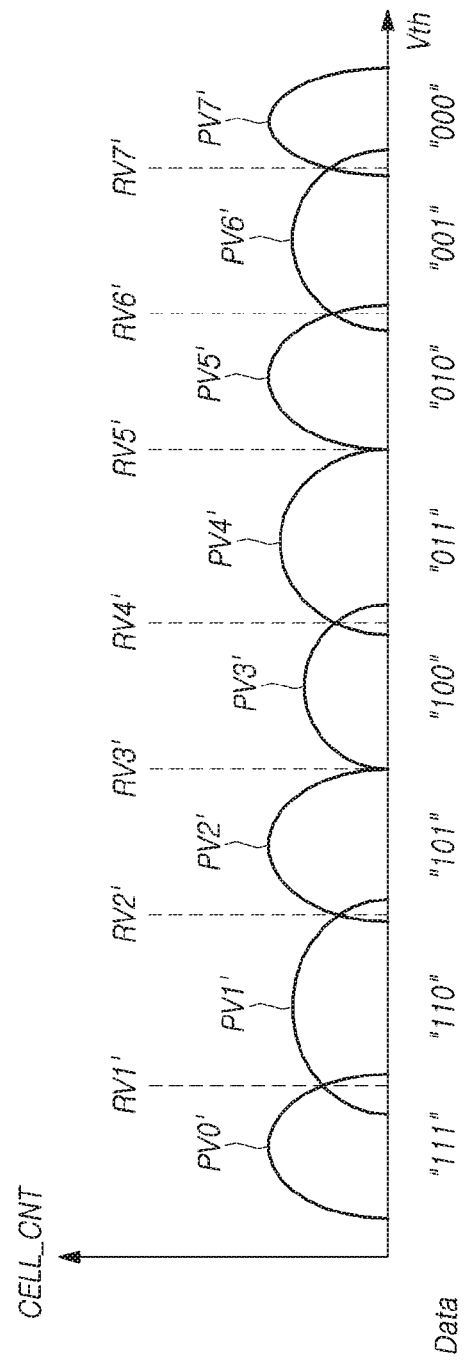
FIG. 5 is a diagram illustrating threshold voltage distributions of memory cells in accordance with an embodiment of the disclosure.

FIG. 5 is a diagram illustrating a representation of another example of threshold voltage distributions of memory cells in accordance with an embodiment of the disclosure.

Referring to FIG. 5, unlike FIG. 4, adjacent threshold voltage distributions among threshold distributions PV0' to PV7' may overlap. For example, the threshold voltage distribution PV0' and the threshold voltage distribution PV1' which are adjacent to each other may overlap, and the threshold voltage distribution PV3' and the threshold voltage distribution PV4' which are adjacent to each other may overlap.

When threshold voltage distributions change such that adjacent threshold voltage distributions overlap, optimum read voltages for distinguishing such threshold voltage distributions, e.g., PV0' to PV7', may also be changed. In this case, various methods for changing optimum read voltages based on changes in threshold voltage distributions may be used.

For example, threshold voltages positioned at the valleys of adjacent threshold voltage distributions may be determined as optimum read voltages. In FIG. 5, read voltages RV1' to RV7' positioned at the valleys between adjacent threshold voltage distributions may be determined as optimum read voltages. This is because, when a read operation is performed based on a read voltage positioned at the valley between adjacent threshold voltage distributions, the number of memory cells from which actually programmed data are read differently is minimized. Embodiments of the disclosure are described below on the assumption that optimum read voltages for changed threshold voltage distributions are determined in this way.

However, even when data of memory cells are read based on the optimum read voltages RV1' to RV7' determined as described above, since the threshold voltage distributions PV0' to PV7' may overlap with each other, the possibility for an error to occur in read data still exists.

As such, if an error occurs when reading data stored in memory cells included in a region where threshold voltage distributions overlap with each other, the memory controller 120 may perform an error correction operation. In this case, the memory controller 120 may perform a soft-decision decoding operation for error correction, and such an operation may be performed by the error detection and correction circuit 126 in the memory controller 120, for example.

An example of the soft-decision decoding operation described above is described in more detail with reference to FIG. 6.

Figure 6:
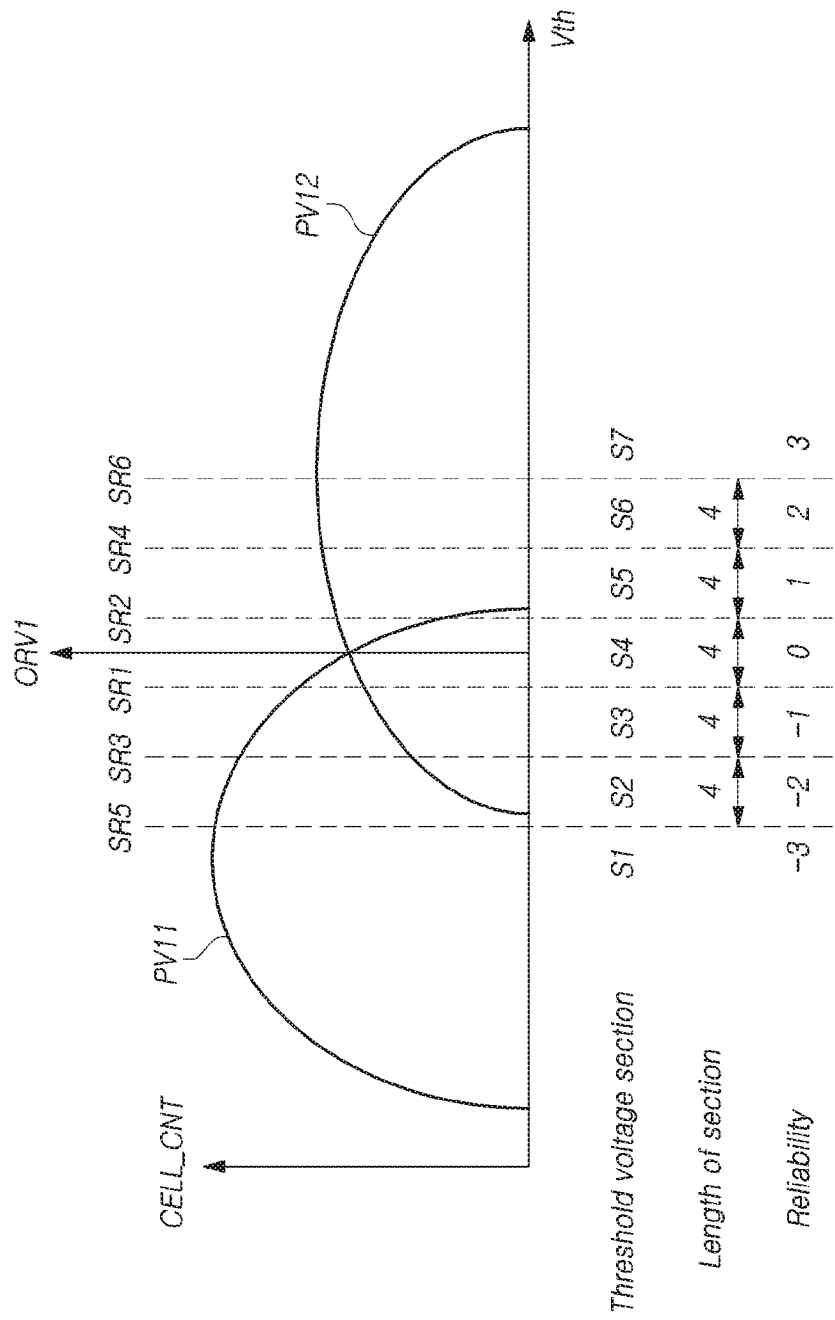
FIG. 6 is a diagram to assist in the explanation of a soft-decision decoding operation for data read from some memory cells in accordance with an embodiment of the disclosure.

FIG. 6 is a diagram to assist in the explanation of a soft-decision decoding operation for data read from some memory cells in accordance with an embodiment of the disclosure.

Threshold voltage distributions PV11 and PV12 illustrated in FIG. 6 may be any two adjacent threshold voltage distributions (e.g., PV2' and PV3') among the threshold voltage distributions PV0' to PV7' of FIG. 5. Further, a first optimum read voltage ORV1 may be any one (e.g., RV3') among the optimum read voltages RV1' to RV7' of FIG. 5.

First, data (i.e., hard-decision data) may be read from a memory cell based on the first optimum read voltage ORV1. If it is determined that there is an error in the hard-decision data, the memory controller 120 may perform a soft-decision decoding operation based on additional soft-decision read voltages SR1 to SR6 to correct the error. FIG. 6 illustrates as an example a case where the number of soft-decision read voltages SR1 to SR6 for performing the soft-decision decoding operation is 6, but the number of soft-decision read voltages is not limited thereto.

Describing the soft-decision decoding operation in detail, first, the memory controller 120 may read data (i.e., soft-decision data) from memory cells based on the soft-decision read voltages SR1 to SR6 described above. The memory controller 120 may determine, through the read soft-decision data, to which threshold voltage sections the respective memory cells correspond among threshold voltage sections S1 to S7 divided by the soft-decision read voltages SR1 to SR6. Each of these threshold voltage sections S1 to S7 has an associated reliability indicator, and hence may be considered and are sometimes referred to as reliability-indicated threshold voltage sections.

Each of the threshold voltage sections S1 to S7 may be determined by one or two of the soft-decision read voltages SR1 to SR6 used as boundaries. For example, the threshold voltage section S1 may be determined as a section of which the threshold voltage is lower than the soft-decision read voltage SR5, and the threshold voltage section S4 may be determined as a section of which the threshold voltage is equal to or higher than the soft-decision read voltage SR1 and lower than the soft-decision read voltage SR2.

The threshold voltage sections S1 to S7 may correspond to specific reliability values, respectively. For example, S1 corresponds to the reliability value of −3, S4 corresponds to the reliability value of 0, and S6 corresponds to the reliability value of 2. The memory controller 120 may assign a reliability value to hard-decision data read from a memory cell, based on a threshold voltage section corresponding to the memory cell and a reliability value corresponding to the threshold voltage section. The memory controller 120 may perform the soft-decision decoding operation in consideration of the hard-decision data and the reliability value assigned thereto.

A reliability value may be determined in various ways. For example, a reliability value may be a log likelihood ratio (LLR). The absolute value of a reliability value may mean the reliability of corresponding hard-decision data, and the larger the absolute value of a reliability value may mean that the reliability (probability not to be an error) of the corresponding hard-decision data is greater.

Therefore, in FIG. 6, the threshold voltage section S4 having a larger region where threshold voltage distributions overlap with each other has the absolute value of reliability that is relatively small, e.g., 0, and the threshold voltage sections S1 and S7 having a smaller or no region where threshold voltage distributions overlap with each other have the absolute value of reliability that is relatively large, e.g., 3.

In this way, in order to correct an error, the memory controller 120 may match the smaller absolute value of a reliability value to a threshold voltage section having a larger region in which threshold voltage distributions overlap with each other.

The sign of a reliability value may indicate the probability that corresponding hard-decision data is "0" and "1." For example, a negative reliability value indicates that a probability for corresponding hard-decision data to be "1" is relatively high, and a positive reliability value indicates that a probability for corresponding hard-decision data to be "0" is relatively high.

The sizes of the above-described reliability-indicated threshold voltage sections S1 to S7 may be determined in various ways. For example, as illustrated in FIG. 6, except for the threshold voltage sections S1 and S7 at both ends, the sizes of the threshold voltage sections S2, S3, S4, S5, and S6 may be determined as the same value of 4.

As described above, a scheme of setting the sizes of the remaining threshold voltage sections except for the threshold voltage sections at both ends to be maximally the same with one another when performing the soft-decision decoding operation may have a high error correction efficacy in the case where the shapes of adjacent threshold voltage distributions are close to the symmetry (in the case where a difference in width between threshold voltage distributions is substantially small). This is because a degree to which reliability changes depending on the difference between a threshold voltage and the first optimum read voltage ORV1 and a degree to which an error occurs during read depending on the difference between the threshold voltage and the first optimum read voltage ORV1 are determined to be similar to each other.

However, if the sizes of threshold voltage sections are set to be maximally the same when the soft-decision decoding operation is performed even in the case where the widths of the adjacent threshold voltage distributions PV11 and PV12 are different as illustrated in FIG. 6, error correction efficacy may decrease in the soft-decision decoding operation. Detailed description for this is given below with reference to FIG. 7.

Figure 7:
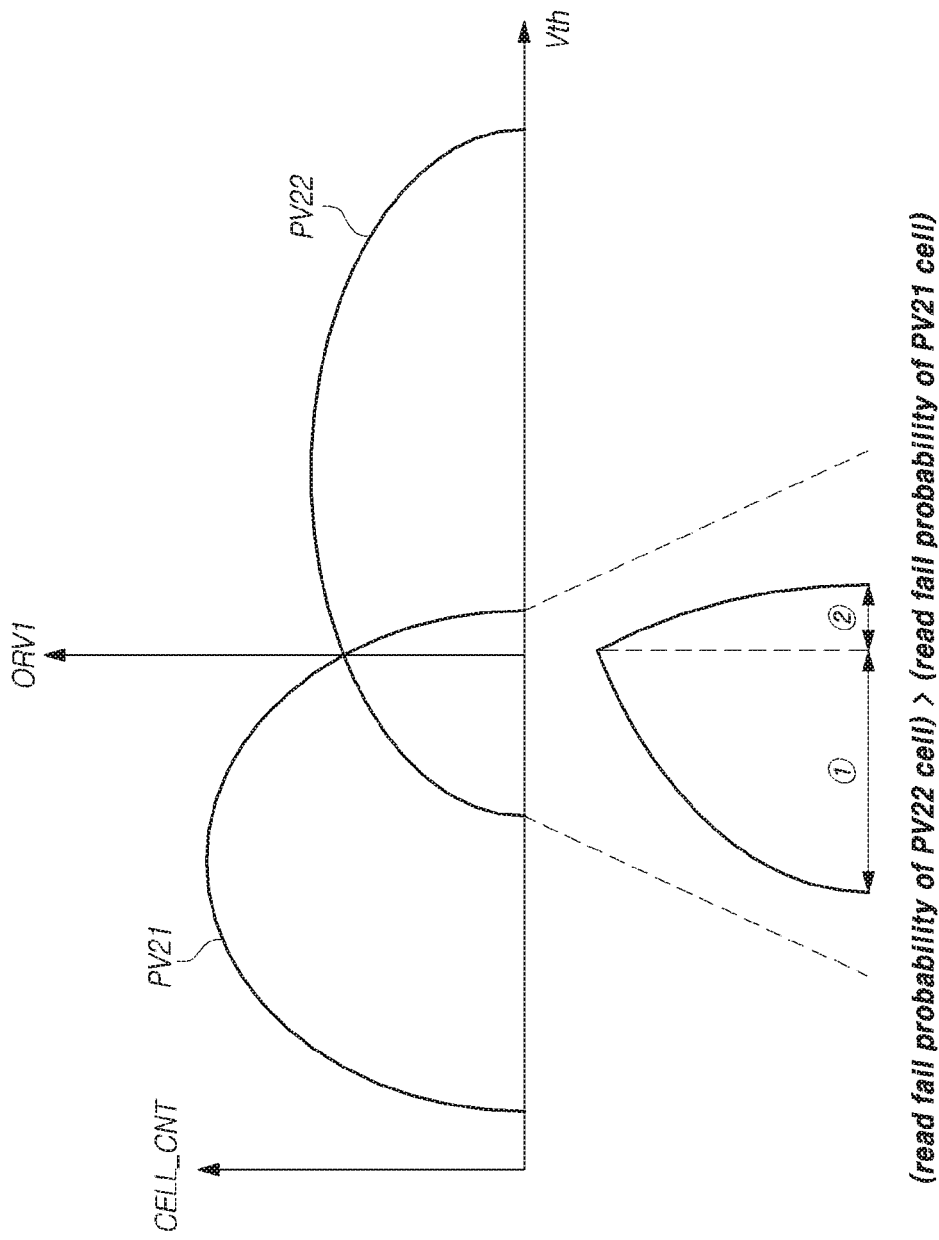
FIG. 7 is a diagram to assist in the explanation of a difference in read fail probability based on a difference in threshold voltage distribution in accordance with an embodiment of the disclosure.

FIG. 7 is a diagram to assist in the explanation of a difference in read fail probability based on a difference in threshold voltage distribution in accordance with an embodiment of the disclosure.

Referring to FIG. 7, threshold voltage distributions PV21 and PV22 adjacent to each other overlap with each other, and a first optimum read voltage ORV1 is positioned at the valley between the threshold voltage distribution PV21 and the threshold voltage distribution PV22.

As in FIG. 6, the threshold voltage distributions PV21 and PV22 illustrated in FIG. 7 may be any two adjacent threshold voltage distributions among the threshold voltage distributions PV0' to PV7' of FIG. 5, and the first optimum read voltage ORV1 may be any one among the optimum read voltages RV1' to RV7' of FIG. 5.

Observing the overlapping region between the adjacent threshold voltage distributions PV21 and PV22, it may be seen that, in the overlapping region, the size of a region ① which is equal to or lower than the first optimum read voltage ORV1 is larger than the size of a region ② which is equal to or higher than the first optimum read voltage ORV1. This means that, when data are read based on the first optimum read voltage ORV1, the read fail probability of a memory cell having threshold voltages in the threshold voltage distribution PV22 is higher than the read fail probability of a memory cell having threshold voltages in the threshold voltage distribution PV21.

Therefore, when soft-decision decoding is performed, the reliability-indicated threshold voltage sections may need to be modified to improve read performance such that error correction probability for the memory cell having threshold voltages in the threshold voltage distribution PV22 becomes higher than error correction probability for the memory cell having threshold voltages in the threshold voltage distribution PV21.

To this end, the size of a threshold voltage section positioned at a left side (in a direction in which a threshold voltage is lower than the first optimum read voltage ORV1) based on the first optimum read voltage ORV1 should be set to be greater than the size of a threshold voltage section positioned at a right side (in a direction in which a threshold voltage is higher than the first optimum read voltage ORV1) based on the first optimum read voltage ORV1. This is because, as described above, since the larger the absolute value of a reliability value is, the greater the reliability of corresponding hard-decision data is, threshold voltage sections should be formed such that a degree to which the absolute value of a reliability value is changed is smaller in the left direction having high error occurrence probability than in the right direction.

An example in which the sizes of reliability-indicated threshold voltage sections positioned at the left and right sides of the first optimum read voltage ORV1 are set to be different is described with reference to FIG. 8.

Figure 8:
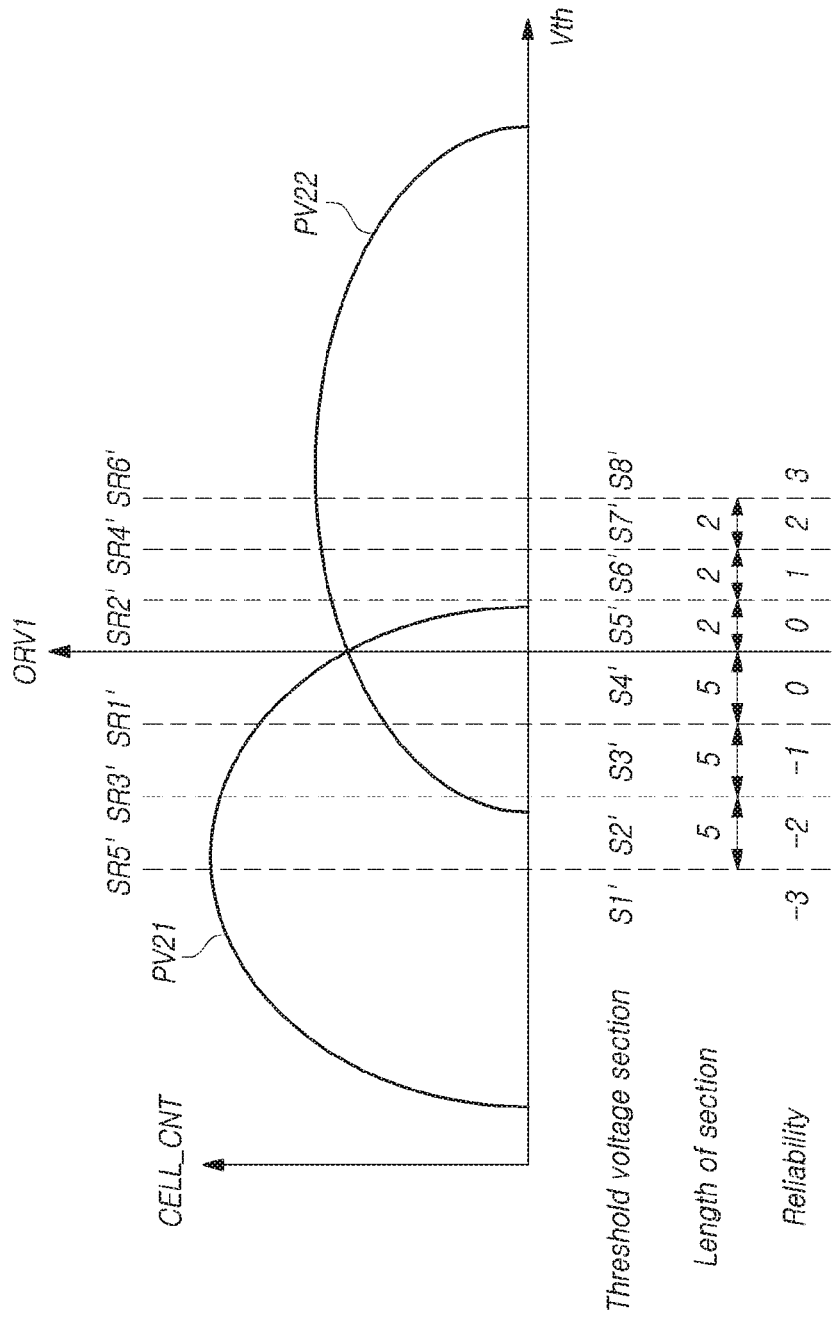
FIG. 8 is a diagram to assist in the explanation of a soft-decision decoding operation for data read from some memory cells in accordance with another embodiment of the disclosure.

FIG. 8 is a diagram to assist in the explanation of a soft-decision decoding operation for data read from some memory cells in accordance with another embodiment of the disclosure.

Threshold voltage distributions PV21 and PV22 illustrated in FIG. 8 may be any two adjacent threshold voltage distributions among the threshold voltage distributions PV0' to PV7' of FIG. 5. Further, a first optimum read voltage ORV1 may be any one among the optimum read voltages RV1' to RV7' of FIG. 5.

First, data (i.e., hard-decision data) may be read from a memory cell based on the first optimum read voltage ORV1. If it is determined that there is an error in the hard-decision data, the memory controller 120 may perform a soft-decision decoding operation based on additional soft-decision read voltages SR1' to SR6'.

The memory controller 120 may read data (i.e., soft-decision data) from memory cells based on the soft-decision read voltages SR1' to SR6' described above. The memory controller 120 may determine, through the read soft-decision data, to which reliability-indicated threshold voltage sections the respective memory cells correspond among the reliability-indicated threshold voltage sections S1' to S8' divided by the soft-decision read voltages SR1' to SR6'.

Each of the threshold voltage sections S1' to S8' may be determined by one or two values, as boundaries, among the soft-decision read voltages SR1' to SR6' and the first optimum read voltage ORV1. For example, S2' may be determined by the soft-decision read voltage SR5' and the soft-decision read voltage SR3' as boundaries, and S5' may be determined by the first optimum read voltage ORV1 and the soft-decision read voltage SR2' as boundaries.

As described with reference to FIG. 6, the threshold voltage sections S1' to S8' described above may correspond to specific reliability values, respectively, and the reliability values may be, for example, log likelihood ratios.

However, unlike FIG. 6, in FIG. 8, the sizes of threshold voltage sections may be different from each other, depending on whether a threshold voltage section is positioned at a left side of the first optimum read voltage ORV1 (in a direction in which a threshold voltage is lower than the first optimum read voltage ORV1) or at a right side of the first optimum read voltage ORV1 (in a direction in which a threshold voltage is higher than the first optimum read voltage ORV1). In FIG. 8, the size of a threshold voltage section positioned at the left side of the first optimum read voltage ORV1 may be determined to be greater than the size of a threshold voltage section positioned at the right side of the first optimum read voltage ORV1.

This is because, as described above, with respect to memory cells existing in a region where the threshold voltage distribution PV21 and the threshold voltage distribution PV22 overlap, the error correction probability of memory cells in the threshold voltage distribution PV22 should be higher than the error correction probability of memory cells in the threshold voltage distribution PV21.

That is to say, a degree to which the absolute value of reliability changes depending on the difference between a threshold voltage positioned at the left side of the first optimum read voltage ORV1 and the first optimum read voltage ORV1 should be smaller than a degree to which the absolute value of reliability changes depending on the difference between a threshold voltage positioned at the right side of the first optimum read voltage ORV1 and the first optimum read voltage ORV1.

Specifically, when threshold voltage sections positioned at the left side of the first optimum read voltage ORV1 are referred to as first threshold voltage sections S1' to S4', and may be determined by the first optimum read voltage ORV1 and the soft-decision read voltages, which are equal to or lower than the first optimum read voltage ORV1.

For example, S2' may be determined by the soft-decision read voltage SR5' and the soft-decision read voltage SR3' as boundaries, and S4' may be determined by the soft-decision read voltage SR1' and the first optimum read voltage ORV1 as boundaries.

In FIG. 8, the size of each of the remaining first threshold voltage sections S2' to S4' excluding the threshold voltage section S1' may be determined as a value of 5.

When threshold voltage sections positioned at the right side of the first optimum read voltage ORV1 are referred to as second threshold voltage sections S5' to S8', the respective second threshold voltage sections S5' to S8' may be determined by the first optimum read voltage ORV1 and the soft-decision read voltages, which are equal to or higher than the first optimum read voltage ORV1.

For example, S6' may be determined by the soft-decision read voltage SR2' and the soft-decision read voltage SR4' as boundaries, and S5' may be determined by the soft-decision read voltage SR2' and the first optimum read voltage ORV1 as boundaries.

In FIG. 8, the size of each of the remaining second threshold voltage sections S5' to S7' excluding the threshold voltage section S8' may be determined as a value of 2 smaller than the value of 5.

The sizes of first threshold voltage sections may be different from one another, depending on a soft-decision decoding scheme, or the sizes of second threshold voltage sections may be different from one another, depending on a soft-decision decoding scheme. On the other hand, the sizes of first threshold voltage sections may be determined to be uniform, and the sizes of second threshold voltage sections may be determined to be uniform. However, even in this case, the size of each threshold voltage section included in the first threshold voltage sections may be different from the size of each threshold voltage section included in the second threshold voltage sections.

In connection with FIG. 8, a case where the width of the threshold voltage distribution PV22 is larger than the width of the threshold voltage distribution PV21 is described. However, the scheme described above with reference to FIG. 8 may be applied in the same manner even to a case where the width of the threshold voltage distribution PV21 is larger than the width of the threshold voltage distribution PV22. In this case, on the contrary, the size of a threshold voltage section positioned at the left side of the first optimum read voltage ORV1 may be determined to be less than the size of a threshold voltage section positioned at the right side of the first optimum read voltage ORV1.

Examples of a method of differently determining a size of first threshold voltage sections and a size of second threshold voltage sections in this way is described below with reference to FIGS. 9 to 16.

Figure 9:
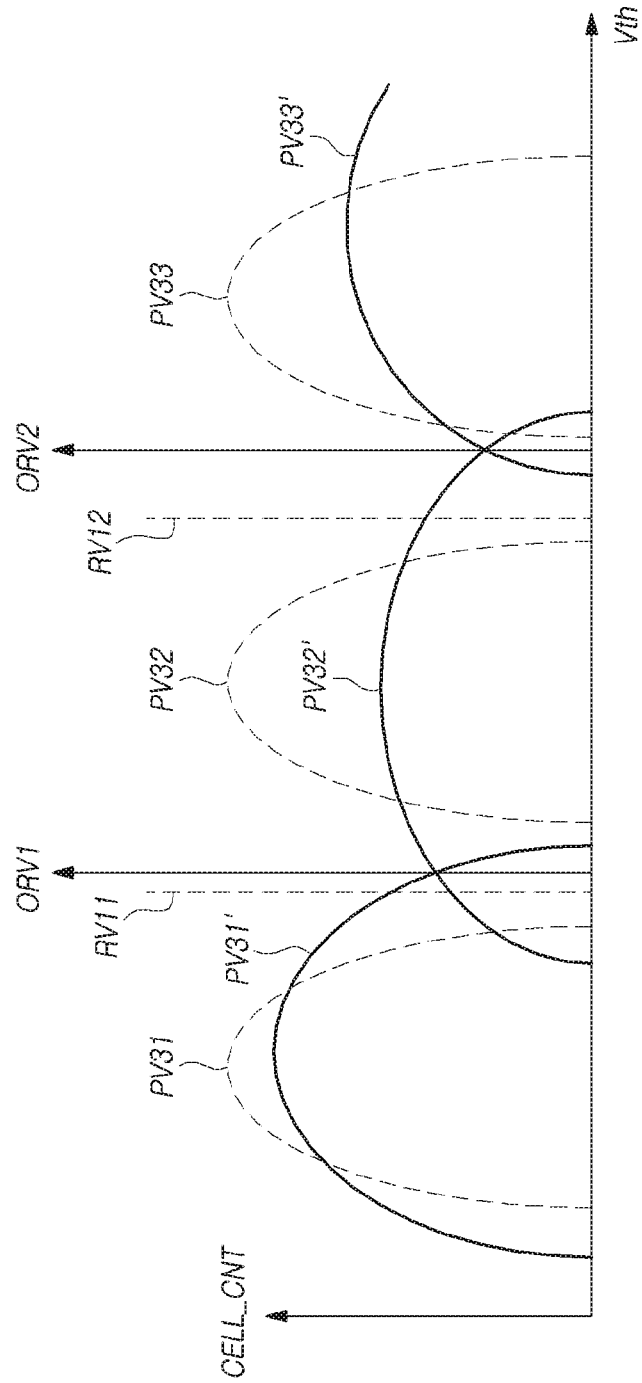
FIG. 9 is a diagram to assist in the explanation of an operation method for differently determining a sizes of threshold voltage sections in accordance with an embodiment of the disclosure.

FIG. 9 is a diagram to assist in the explanation of an example of an operation method for differently determining a size of first threshold voltage sections and a size of second threshold voltage sections in accordance with an embodiment of the disclosure.

It is assumed that one or more optimum read voltages are determined in advance. For example, the optimum read voltages may be determined during a previous read operation of success. FIG. 9 illustrates a case where a first optimum read voltage ORV1 is a lowest one among the optimum read voltages. In this case, a second optimum read voltage ORV2 as a comparison target exists at a right side of the first optimum read voltage ORV1, but no optimum read voltage as a comparison target exists at a left side of the first optimum read voltage ORV1. The second optimum read voltage ORV2 is an optimum read voltage having a minimum difference from the first optimum read voltage ORV1 among the one or more optimum read voltages described above.

For example, the first optimum read voltage ORV1 may be the optimum read voltage RV1' of FIG. 5, and the second optimum read voltage ORV2 may be the optimum read voltage RV2' of FIG. 5.

Referring to FIG. 9, threshold voltage distributions PV31, PV32 and PV33 may be degraded due to various causes, and may change to threshold voltage distributions PV31', PV32' and PV33' respectively. The threshold voltage distributions PV31, PV32 and PV33 may be, for example, the threshold voltage distributions PV0, PV1 and PV2 of FIG. 4, and the threshold voltage distributions PV31', PV32' and PV33' may be, for example, the threshold voltage distributions PV0', PV1' and PV2' of FIG. 5.

If threshold voltage distributions change in this way, the values of optimum read voltages change accordingly. For example, an optimum read voltage RV11 positioned between PV31 and PV32 may change to the first optimum read voltage ORV1, and an optimum read voltage RV12 positioned between PV32 and PV33 may change to the second optimum read voltage ORV2.

In this case, depending on whether the difference or interval between changed optimum read voltages (the difference between ORV1 and ORV2) has increased or decreased in comparison with the difference between previous optimum read voltages (the difference between RV11 and RV12, hereinafter, referred to as a reference read voltage difference REF_RVD), a characteristic of a threshold voltage section to be used when performing soft-decision decoding based on the first optimum read voltage ORV1 may be changed. The reference read voltage difference REF_RVD may be determined at a specific time point, for example, immediately after a program operation for a memory cell is completed.

Specifically, when the difference between the first optimum read voltage ORV1 and the second optimum read voltage ORV2 is larger than the reference read voltage difference REF_RVD, The memory controller may determine that the width of the threshold voltage distribution PV32' is larger than the width of the threshold voltage distribution PV31' because the first optimum read voltage ORV1 decreases and the second optimum read voltage ORV2 increases when the width of the threshold voltage distribution PV32' becomes larger. This means that a degree of degradation of the threshold voltage distribution PV32 to the threshold voltage distribution PV32' is larger than a degree of degradation of the threshold voltage distribution PV31 to the threshold voltage distribution PV31'. Therefore, in order to increase error correction possibility for data read from memory cells included in the threshold voltage distribution PV32', the memory controller 120 needs to determine the size of first threshold voltage sections positioned at a left side of the first optimum read voltage ORV1 to be larger than the size of second threshold voltage sections positioned at a right side of the first optimum read voltage ORV1, when performing soft-decision decoding.

Conversely, if the difference between the first optimum read voltage ORV1 and the second optimum read voltage ORV2 is smaller than REF_RVD, the memory controller 120 may determine the size of the first threshold voltage sections positioned at the left side of the first optimum read voltage ORV1 to be smaller than the size of the second threshold voltage sections positioned at the right side of the first optimum read voltage ORV1.

Figure 10:
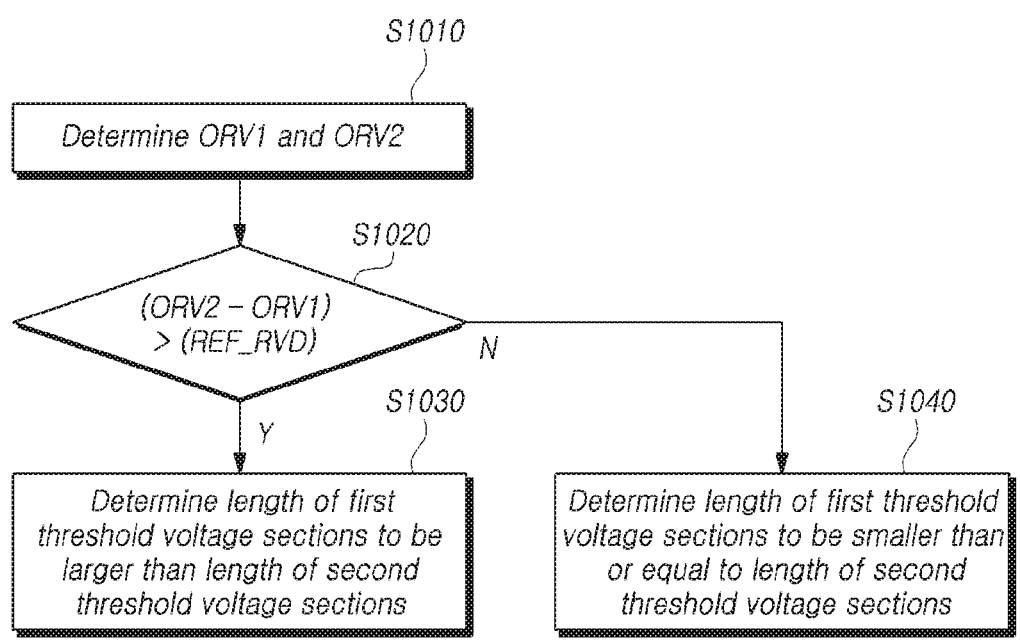
FIG. 10 is a flow chart to assist in the explanation of the operation method described with reference to FIG. 9.

FIG. 10 is a flow chart to assist in the explanation of the operation method described above with reference to FIG. 9.

Referring to FIG. 10, first, the memory controller 120 may determine the first optimum read voltage ORV1 and the second optimum read voltage ORV2 (S1010). As described above with reference to FIG. 9, the first optimum read voltage ORV1 may be a lowest one among optimum read voltages, and the second optimum read voltage ORV2 may be an optimum read voltage having a minimum difference from the first optimum read voltage ORV1 among the optimum read voltages.

The memory controller 120 compares whether the difference between the first optimum read voltage ORV1 and the second optimum read voltage ORV2 is larger than the reference read voltage difference REF_RVD described above (S1020).

If the difference between the first optimum read voltage ORV1 and the second optimum read voltage ORV2 is larger than REF_RVD (S1020-Y), the memory controller 120 may determine the size of the first threshold voltage sections to be larger than the size of the second threshold voltage sections (S1030).

Conversely, if the difference between the first optimum read voltage ORV1 and the second optimum read voltage ORV2 is equal to or smaller than REF_RVD (S1020-N), the memory controller 120 may determine the size of the first threshold voltage sections to be equal to or smaller than the size of the second threshold voltage sections (S1040).

Figure 11:
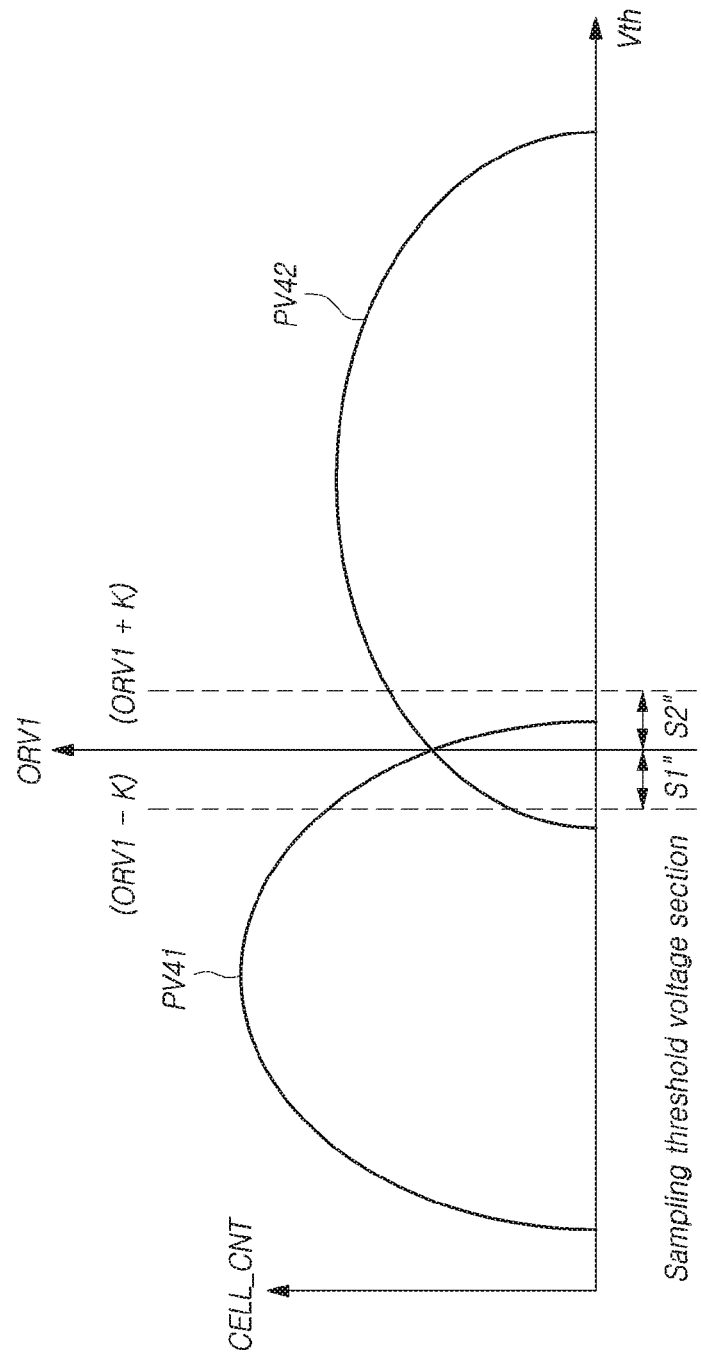
FIG. 11 is a diagram to assist in the explanation of an operation method for differently determining sizes of threshold voltage sections in accordance with an embodiment of the disclosure.

FIG. 11 is a diagram to assist in the explanation of an operation method for differently determining a size of first threshold voltage sections and a size of second threshold voltage sections in accordance with another embodiment of the disclosure.

FIG. 11 illustrates a case where a first optimum read voltage ORV1 is a highest one of one or more optimum read voltages. For instance, the first optimum read voltage ORV1 may be the optimum read voltage RV7' of FIG. 5.

In this case, no optimum read voltage as a comparison target exists at a right side of the first optimum read voltage ORV1. In this case, it is difficult to directly compare the width difference between a threshold voltage distribution PV41 and a threshold voltage distribution PV42.

Thus, the memory controller 120 may form a first sampling threshold voltage section S1" and a second sampling threshold voltage section S2" at left and right sides of the first optimum read voltage ORV1, respectively, and then, may determine the size of first threshold voltage sections and the size of second threshold voltage sections by comparing the numbers of memory cells having threshold voltages in the respective sampling threshold voltage sections.

The first sampling threshold voltage section S1" may be determined by the first optimum read voltage ORV1 and a read voltage ORV1−K lower by K (K is a positive number) than the first optimum read voltage ORV1, as boundaries. The second sampling threshold voltage section S2" may be determined by the first optimum read voltage ORV1 and a read voltage ORV1+K higher by K (K is a positive number) than the first optimum read voltage ORV1, as boundaries. In this case, the sizes of the first sampling threshold voltage section S1" and the second sampling threshold voltage section S2" may be the same.

If the number CELL_CNT_S1" of memory cells having threshold voltages in the first sampling threshold voltage section S1" is larger than the number CELL_CNT_S2" of memory cells having threshold voltages in the second sampling threshold voltage section S2", it means that the number of memory cells of which the threshold voltages are lower than the first optimum read voltage ORV1 among the memory cells in the threshold voltage distribution PV42 is larger than the number of memory cells of which the threshold voltage are higher than the first optimum read voltage ORV1 among the memory cells in the threshold voltage distribution PV41. This means that error occurrence possibility for data read from the memory cells included in the threshold voltage distribution PV42 is high.

Therefore, in order to increase error correction efficacy for the data read from the memory cells in the threshold voltage distribution PV42, the memory controller 120 may determine the size of the first threshold voltage sections to be larger than the size of the second threshold voltage sections, when performing soft-decision decoding.

Conversely, if the number CELL_CNT_S1" of memory cells having threshold voltages in the first sampling threshold voltage section S1" is larger than the number CELL_CNT_S2" of memory cells having threshold voltages in the second sampling threshold voltage section S2", the memory controller 120 may determine the size of the first threshold voltage sections to be smaller than the size of the second threshold voltage sections, when performing soft-decision decoding.

Figure 12:
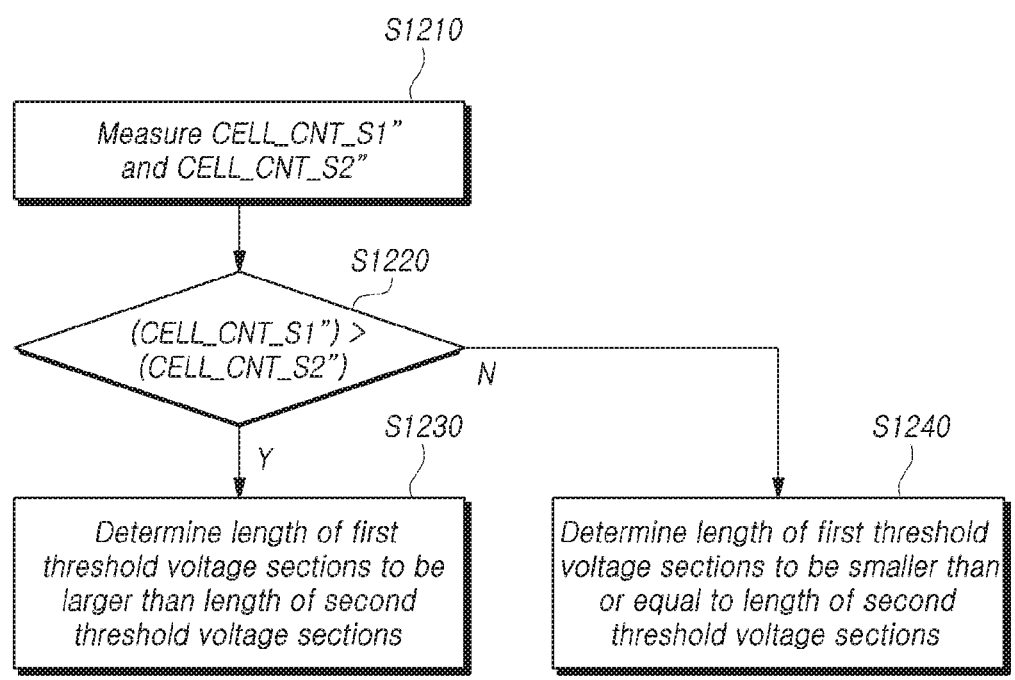
FIG. 12 is a flow chart to assist in the explanation of the operation method described with reference to FIG. 11.

FIG. 12 is a flow chart to assist in the explanation of the operation method described above with reference to FIG. 11.

Referring to FIG. 12, first, the memory controller 120 may measure the number CELL_CNT_S1" of memory cells having threshold voltages in the first sampling threshold voltage section S1" and the number CELL_CNT_S2" of memory cells having threshold voltages in the second sampling threshold voltage section S2" (S1210).

The memory controller 120 compares whether the number CELL_CNT_S1" of the memory cells having threshold voltages in the first sampling threshold voltage section S1" is larger than the number CELL_CNT_S2" of the memory cells having threshold voltages in the second sampling threshold voltage section S2" (S1220).

If the number CELL_CNT_S1" of the memory cells having threshold voltages in the first sampling threshold voltage section S1" is larger than the number CELL_CNT_S2" of the memory cells having threshold voltages in the second sampling threshold voltage section S2" (S1220-Y), the memory controller 120 may determine the size of the first threshold voltage sections positioned at the left side of the first optimum read voltage ORV1 to be larger than the size of the second threshold voltage sections positioned at the right side of the first optimum read voltage ORV1 (S1230).

Conversely, if the number CELL_CNT_S1" of the memory cells having threshold voltages in the first sampling threshold voltage section S1" is smaller than or equal to the number CELL_CNT_S2" of the memory cells having threshold voltages in the second sampling threshold voltage section S2" (S1220-N), the memory controller 120 may determine the size of the first threshold voltage sections positioned at the left side of the first optimum read voltage ORV1 to be smaller than or equal to the size of the second threshold voltage sections positioned at the right side of the first optimum read voltage ORV1 (S1240).

Figure 13:
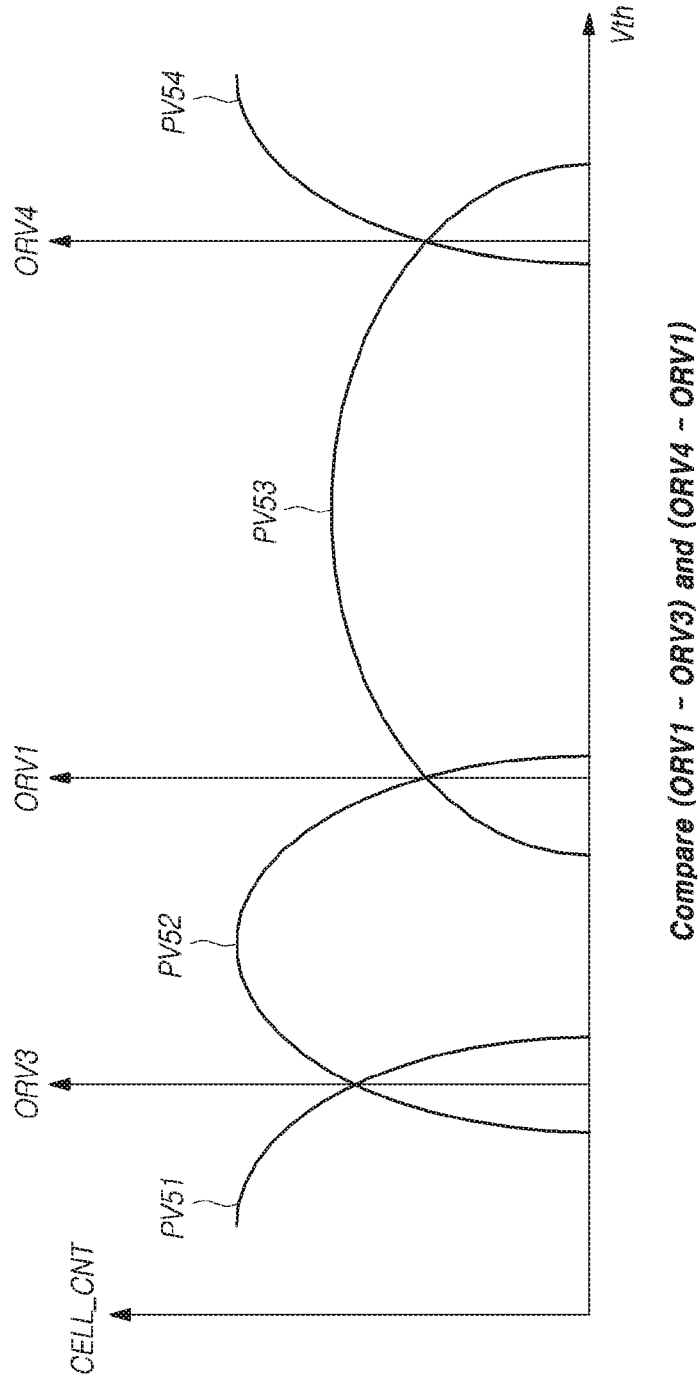
FIG. 13 is a diagram to assist in the explanation of an operation method for differently determining sizes of threshold voltage regions in accordance with an embodiment of the disclosure.

FIG. 13 is a diagram to assist in the explanation of an operation method for differently determining a size of first threshold voltage sections and a size of second threshold voltage sections in accordance with an embodiment of the disclosure.

FIG. 13 illustrates a case where at least one optimum read voltage lower than a first optimum read voltage ORV1 and at least one optimum read voltage higher than the first optimum read voltage ORV1 exist among one or more optimum read voltages. For instance, the first optimum read voltage ORV1 may be the optimum read voltage RV4' of FIG. 5.

The memory controller 120 may determine a third optimum read voltage ORV3 which is a highest one among optimum read voltages lower than the first optimum read voltage ORV1 and a fourth optimum read voltage ORV4 which is a lowest one among optimum read voltages higher than the first optimum read voltage ORV1. For example, when the first optimum read voltage ORV1 is the optimum read voltage RV4' of FIG. 5, the third optimum read voltage ORV3 may be the optimum read voltage RV3' of FIG. 5, and the fourth optimum read voltage ORV4 may be the optimum read voltage RV5' of FIG. 5.

The memory controller 120 may determine the size of first threshold voltage sections and the size of second threshold voltage sections by comparing 1) an offset or interval ORV1-ORV3 between the first optimum read voltage ORV1 and the third optimum read voltage ORV3 and 2) an offset or interval ORV4-ORV1 between the first optimum read voltage ORV1 and the fourth optimum read voltage ORV4.

If the offset ORV1-ORV3 between the first optimum read voltage ORV1 and the third optimum read voltage ORV3 is larger than the offset ORV4-ORV1 between the first optimum read voltage ORV1 and the fourth optimum read voltage ORV4, it means that the width of a threshold voltage distribution PV52 is larger than the width of a threshold voltage distribution PV53.

Therefore, in order to increase error correction possibility for data read from memory cells included in the threshold voltage distribution PV52, the memory controller 120 may determine the size of the first threshold voltage sections to be smaller than the size of the second threshold voltage sections, in a soft-decision decoding operation.

Conversely, if the offset ORV1-ORV3 between the first optimum read voltage ORV1 and the third optimum read voltage ORV3 is greater than the offset ORV4-ORV1 between the first optimum read voltage ORV1 and the fourth optimum read voltage ORV4, the memory controller 120 needs to determine the size of the first threshold voltage sections to be less than the size of the second threshold voltage sections, in a soft-decision decoding operation.

Figure 14:
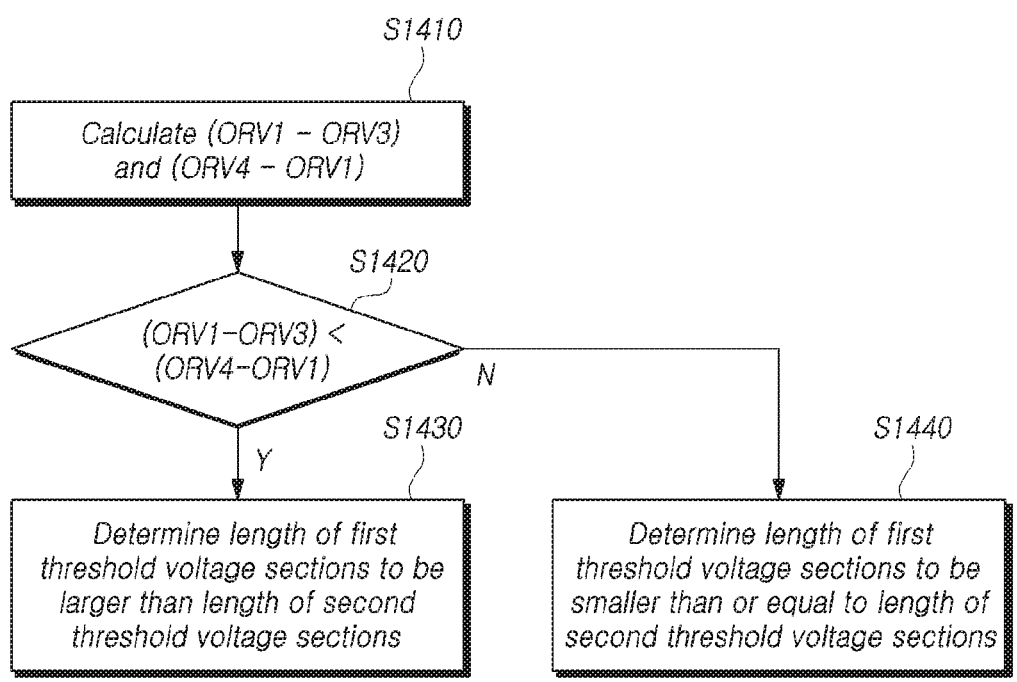
FIG. 14 is a flow chart to assist in the explanation of the operation method described with reference to FIG. 13.

FIG. 14 is a flow chart to assist in the explanation of the operation method described above with reference to FIG. 13.

Referring to FIG. 14, first, the memory controller 120 may calculate the offset ORV1-ORV3 between the first optimum read voltage ORV1 and the third optimum read voltage ORV3 and the offset ORV4-ORV1 between the first optimum read voltage ORV1 and the fourth optimum read voltage ORV4 (S1410).

The memory controller 120 compares whether the offset ORV1-ORV3 between the first optimum read voltage ORV1 and the third optimum read voltage ORV3 is smaller than the offset ORV4-ORV1 between the first optimum read voltage ORV1 and the fourth optimum read voltage ORV4 (S1420).

If the offset ORV1-ORV3 between the first optimum read voltage ORV1 and the third optimum read voltage ORV3 is smaller than the offset ORV4-ORV1 between the first optimum read voltage ORV1 and the fourth optimum read voltage ORV4 (S1420-Y), the memory controller 120 may determine the size of the first threshold voltage sections to be larger than the size of the second threshold voltage sections (S1430).

Conversely, if the offset ORV1-ORV3 between the first optimum read voltage ORV1 and the third optimum read voltage ORV3 is larger than or equal to the offset ORV4-ORV1 between the first optimum read voltage ORV1 and the fourth optimum read voltage ORV4 (S1420-N), the memory controller 120 may determine the size of the first threshold voltage sections to be smaller than or equal to the size of the second threshold voltage sections (S1440).

In the above-described embodiments of the disclosure, a method of determining a size of first threshold voltage sections and a size of second threshold voltage sections by comparing differences between optimum read voltages has been described. However, if an average threshold voltage of a threshold voltage distribution is obtained, the average threshold voltage may be used in determining a size of first threshold voltage sections and a size of second threshold voltage sections.

Figure 15:
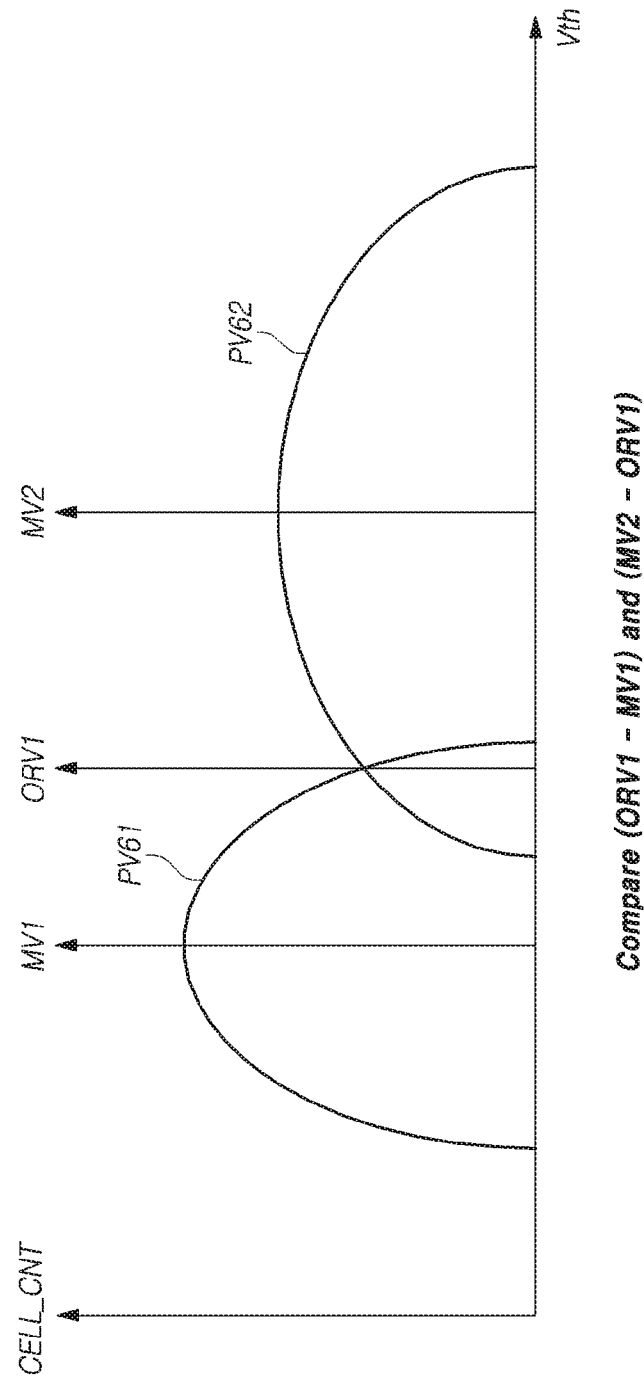
FIG. 15 is a diagram to assist in the explanation of an operation method for differently determining sizes of threshold voltage regions in accordance with another embodiment of the disclosure.

FIG. 15 is a diagram to assist in the explanation of yet another example of an operation method for differently determining a size of first reliability sections and a size of second reliability sections in accordance with the embodiments of the disclosure.

Referring to FIG. 15, with respect to a first optimum read voltage ORV1, a first threshold voltage distribution PV61 and a second threshold voltage distribution PV62 adjacent to the first optimum read voltage ORV1 may be determined. The first threshold voltage distribution PV61 and the second threshold voltage distribution PV62 adjacent to the first optimum read voltage ORV1 may be threshold voltage distributions in which differences between average of threshold voltages of memory cells included therein and the first optimum read voltage ORV1 are smallest, among one or more optimum read voltages.

The first threshold voltage distribution PV61 may be positioned at a left side of the first optimum read voltage ORV1, and the second threshold voltage distribution PV62 may be positioned at a right side of the first optimum read voltage ORV1. For example, when the first optimum read voltage ORV1 is the optimum read voltage RV4' of FIG. 5, the first threshold voltage distribution PV61 may be the threshold voltage distribution PV3' of FIG. 5, and the second threshold voltage distribution PV62 may be the threshold voltage distribution PV4' of FIG. 5.

The memory controller 120 may calculate an average threshold voltage MV1 of the first threshold voltage distribution PV61 and an average threshold voltage MV2 of the second threshold voltage distribution PV62.

A method of calculating an average threshold voltage of a threshold voltage distribution may be performed in various ways. For example, the memory controller 120 may calculate the numbers of cells having threshold voltages in threshold voltage sections, which are divided by reference voltages, based on data read by applying the reference voltages to memory cells, and may calculate an average threshold voltage on the assumption that a threshold voltage distribution determined based on the calculated numbers of section cells follows the Gaussian distribution. The reference voltages may be preset voltages having regular intervals from each other. The intervals may be determined by the memory controller 120.

When the average threshold voltage MV1 of the first threshold voltage distribution PV61 and the average threshold voltage MV2 of the second threshold voltage distribution PV62 are calculated, the memory controller 120 may determine the size of first threshold voltage sections and the size of second threshold voltage sections by comparing 1) an offset ORV1-MV1 between the first optimum read voltage ORV1 and the average threshold voltage MV1 of the first threshold voltage distribution PV61 and 2) an offset MV2-ORV1 between the first optimum read voltage ORV1 and the average threshold voltage MV2 of the second threshold voltage distribution PV62.

If the offset ORV1-MV1 between the first optimum read voltage ORV1 and the average threshold voltage MV1 of the first threshold voltage distribution PV61 is smaller than the offset MV2-ORV1 between the first optimum read voltage ORV1 and the average threshold voltage MV2 of the second threshold voltage distribution PV62, it means that the width of the first threshold voltage distribution PV61 is smaller than the width of the second threshold voltage distribution PV62. Since this means that the second threshold voltage distribution PV62 is further degraded than the first threshold voltage distribution PV61, in order to increase the error correction possibility for data read from memory cells included in the second threshold voltage distribution PV62, the memory controller 120 may determine the size of the first threshold voltage sections to be larger than the size of the second threshold voltage sections, when performing soft-decision decoding.

Figure 16:
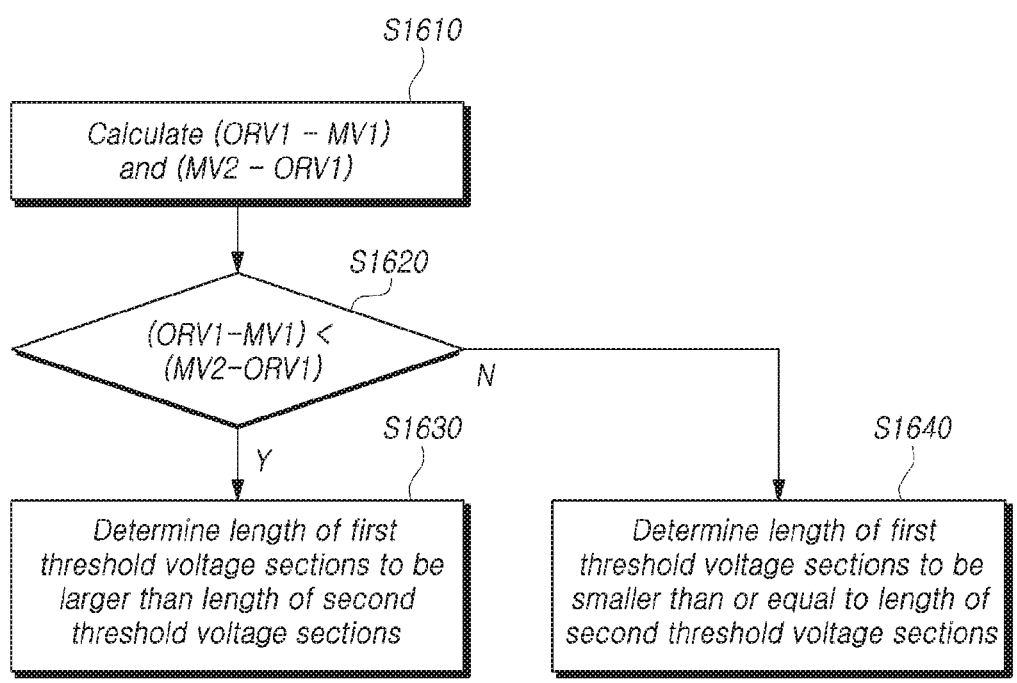
FIG. 16 is a flow chart to assist in the explanation of the operation method described with reference to FIG. 15.

FIG. 16 is a flow chart to assist in the explanation of the operation method described above with reference to FIG. 15.

Referring to FIG. 16, first, the memory controller 120 may calculate the offset or interval ORV1-MV1 between the first optimum read voltage ORV1 and the average threshold voltage MV1 of the first threshold voltage distribution PV61 and the offset or interval MV2-ORV1 between the first optimum read voltage ORV1 and the average threshold voltage MV2 of the second threshold voltage distribution PV62 (S1610).

The memory controller 120 determines whether the offset ORV1-MV1 between the first optimum read voltage ORV1 and the average threshold voltage MV1 of the first threshold voltage distribution PV61 is smaller than the offset MV2-ORV1 between the first optimum read voltage ORV1 and the average threshold voltage MV2 of the second threshold voltage distribution PV62 (S1620).

If the offset ORV1-MV1 between the first optimum read voltage ORV1 and the average threshold voltage MV1 of the first threshold voltage distribution PV61 is smaller than the offset MV2-ORV1 between the first optimum read voltage ORV1 and the average threshold voltage MV2 of the second threshold voltage distribution PV62 (S1620-Y), the memory controller 120 may determine the size of the first threshold voltage sections to be larger than the size of the second threshold voltage sections (S1630).

Conversely, if the offset ORV1-MV1 between the first optimum read voltage ORV1 and the average threshold voltage MV1 of the first threshold voltage distribution PV61 is larger than or equal to the offset MV2-ORV1 between the first optimum read voltage ORV1 and the average threshold voltage MV2 of the second threshold voltage distribution PV62 (S1620-N), the memory controller 120 may determine the size of the first threshold voltage sections to be smaller than or equal to the size of the second threshold voltage sections (S1640).

Figure 17:
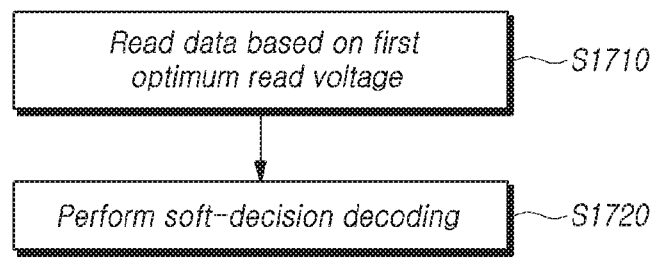
FIG. 17 is a flow chart to assist in the explanation of a method for operating the memory system in accordance with an embodiment of the disclosure.

FIG. 17 is a flow chart to assist in the explanation of a method for operating the memory system 100 in accordance with an embodiment of the disclosure.

Referring to FIG. 17, the memory system 100 may read data from some among a plurality of memory cells included in the memory device 110 included in the memory system 100, based on a first optimum read voltage which is one of one or more optimum read voltages (S1710). The step S1710 may be executed through the memory controller 120 included in the memory system 100.

When the memory system 100 fails to read data based on the first optimum read voltage at step S1710, the memory system 100 may perform soft-decision decoding based on reliability values of 1) one or more first threshold voltage sections, 2) one or more second threshold voltage sections and 3) first threshold voltage sections and second threshold voltage sections (S1720). The step S1720 may be executed through the memory controller 120 included in the memory system 100.

As described with reference to FIG. 8, the first threshold voltage sections may be determined by read voltages, as boundaries, which are lower than or equal to the first optimum read voltage, and the second threshold voltage sections may be determined by read voltages, as boundaries, which are higher than or equal to the first optimum read voltage. The size of the first threshold voltage sections and the size of the second threshold voltage sections may be different.

The size of the first threshold voltage sections and the size of second threshold voltage sections may be determined in various ways.

For example, when the memory system 100 performs soft-decision decoding as described above with reference to FIGS. 9 and 10, the memory system 100 may, in the case where a first optimum read voltage is a lowest one among one or more optimum read voltages, determine a size of first threshold voltage sections and a size of second threshold voltage sections based on the first optimum read voltage and a second optimum read voltage. The second optimum read voltage may be an optimum read voltage having a minimum difference from the first optimum read voltage among the optimum read voltages.

For another example, when the memory system 100 performs soft-decision decoding as described above with reference to FIGS. 11 and 12, the memory system 100 may, in the case where a first optimum read voltage is a highest one among one or more optimum read voltages, determine a size of first threshold voltage sections and a size of second threshold voltage sections, by comparing 1) the number of memory cells having threshold voltages in a first sampling threshold voltage section determined by the first optimum read voltage and a read voltage lower by K (K is a positive number) than the first optimum read voltage, as boundaries, and 2) the number of memory cells having threshold voltages in a second sampling threshold voltage section determined by the first optimum read voltage and a read voltage higher by K than the first optimum read voltage, as boundaries.

For still another example, when the memory system 100 performs soft-decision decoding as described above with reference to FIGS. 13 and 14, the memory system 100 may, in the case where at least one optimum read voltage lower than a first optimum read voltage and at least one optimum read voltage higher than the first optimum read voltage exist among one or more optimum read voltages, determine a size of first threshold voltage sections and a size of second threshold voltage sections, by comparing 1) an offset between the first optimum read voltage and a third optimum read voltage which is a highest one among optimum read voltages lower than the first optimum read voltage and 2) an offset between the first optimum read voltage and a fourth optimum read voltage which is a lowest one among optimum read voltages higher than the first optimum read voltage.

The above-described operation of the memory controller 120 may be controlled by the control circuit 123, and may be performed in such a manner that the processor 124 executes (drives) firmware in which all operations of the memory controller 120 are programmed.

Figure 18:
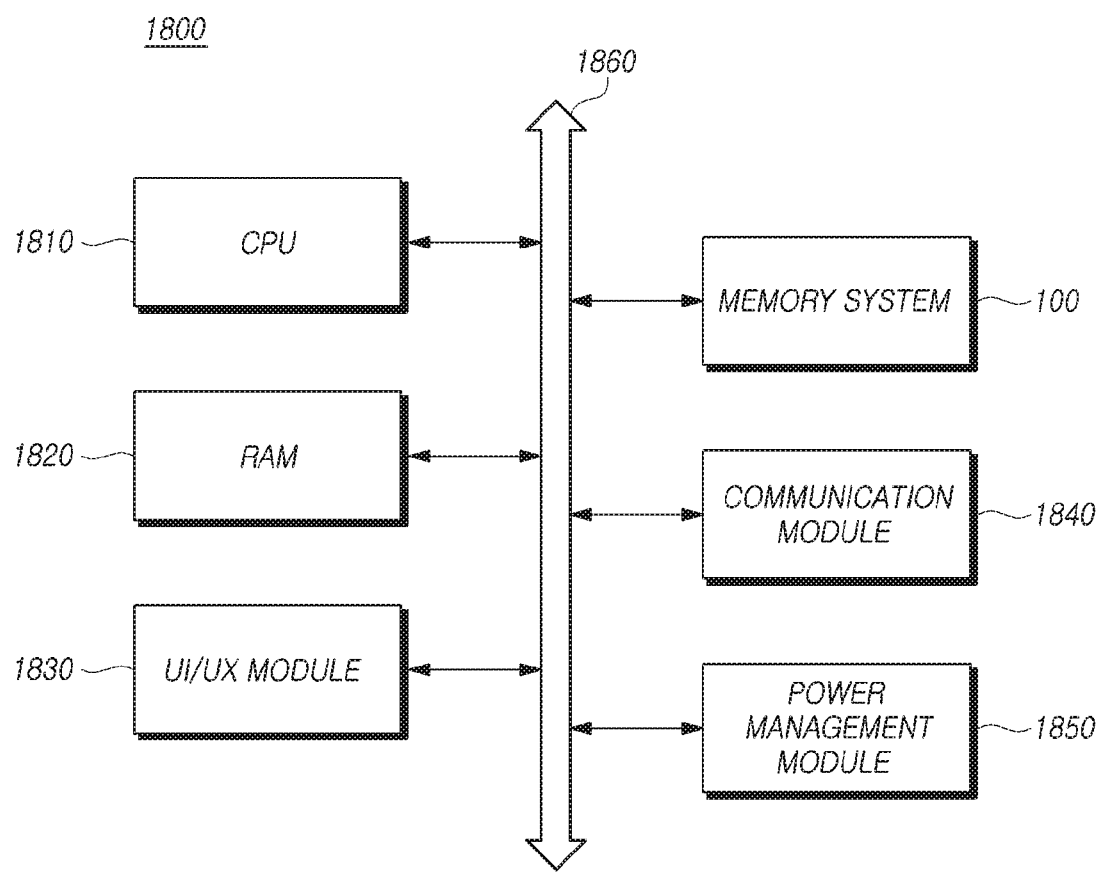
FIG. 18 is a block diagram schematically illustrating a computing system in accordance with embodiments of the disclosure.

FIG. 18 is a block diagram schematically illustrating a representation of an example of a computing system 1800 in accordance with embodiments of the disclosure.

Referring to FIG. 18, the computing system 1800 may include a memory system 100, a central processing unit (CPU) 1810 for controlling general operations of the computing system 1800, a RAM 1820 for storing data and information related with operations of the computing system 1800, a UI/UX (user interface/user experience) module 1830 for providing use environment to a user, a communication module 1840 for communicating with an external device in a wired and/or wireless manner and a power management module 1850 for managing power used by the computing system 1800, which are electrically coupled to a system bus 1860.

The computing system 1800 may include a PC (personal computer), a mobile terminal such as a smartphone and a tablet or various electronic devices.

The computing system 1800 may further include a battery for supplying an operating voltage, and may further include an application chipset, a graphic-related module, a camera image processor (CIS), a DRAM and so forth. As those skilled in the art will understand, the computing system 1800 may include other components.

In an embodiment, the memory system 100 may include a device which stores data in a magnetic disk, such as a hard disk drive (HDD), whereas in another embodiment the memory system 100 may include a device which stores data in a nonvolatile memory, such as a solid state drive (SDD), a universal flash storage (UFS) device and/or an embedded MMC (eMMC) device. The nonvolatile memory may include a ROM (read only memory), a PROM (programmable ROM), an EPROM (electrically programmable ROM), an EEPROM (electrically erasable and programmable ROM), a flash memory, a PRAM (phase-change RAM), an MRAM (magnetic RAM), an RRAM (resistive RAM), and/or an FRAM (ferroelectric RAM). In addition, the memory system 100 may be realized as any of various types of storage devices, and may be mounted in any of various electronic devices.

As is apparent from the above description, according to embodiments of the disclosure, it is possible to provide a memory system, a memory controller and a method for operating a memory system, capable of increasing error correction efficacy by soft-decision decoding even in the case where threshold voltage distributions of memory cells in which data is stored are degraded.

Although various embodiments of the invention have been illustrated and described, those skilled in the art will appreciate in light of the present disclosure that various modifications, additions and substitutions are possible, without departing from the scope and spirit of the invention. Therefore, the embodiments disclosed herein should be considered in a descriptive sense only and not for limiting the scope of the invention. The scope of the invention is not limited by the embodiments and the accompanying drawings. The invention encompasses all modifications and variations that fall within the scope of the appended claims and including their equivalents.

What is claimed is:

1. A memory system comprising:
a memory device comprising a plurality of memory cells; and
a memory controller configured to control the memory device,
wherein the memory controller is further configured to perform soft-decision decoding for data read from some of the plurality of memory cells based on a first optimum read voltage of one or more optimum read voltages, based on reliability values of one or more first threshold voltage sections and one or more second threshold voltage sections, and also based on the first and second threshold voltage sections, wherein the one or more first threshold voltage sections are determined by read voltages which are lower than the first optimum read voltage, and the one or more second threshold voltage sections are determined by read voltages which are higher than the first optimum read voltage, wherein the memory controller is further configured to determine a size of the one or more first threshold voltage sections to be different than a size of the one or more second threshold voltage sections, and wherein the size of two or more of the first threshold voltage sections is the same, and the size of two or more of the second threshold voltage sections is the same.

2. The memory system according to claim 1,
wherein the size of each of the first threshold voltage sections is the same, and
wherein the size of each of the second threshold voltage sections is the same.

3. The memory system according to claim 1,
wherein, when the first optimum read voltage is a lowest of the one or more optimum read voltages, the memory controller determines the size of each of the first threshold voltage sections and the size of each of the second threshold voltage sections based on the first optimum read voltage and a second optimum read voltage, and
wherein the second optimum read voltage has a minimum difference from the first optimum read voltage among the one or more optimum read voltages.

4. The memory system according to claim 3, wherein, when a difference between the first optimum read voltage and the second optimum read voltage is larger than a reference read voltage difference, the memory controller determines the size of each of the first threshold voltage sections to be larger than the size of each of the second threshold voltage sections.

5. The memory system according to claim 1, wherein, when the first optimum read voltage is a highest of the one or more optimum read voltages, the memory controller determines the size of each of the first threshold voltage sections and the size of each of the second threshold voltage sections, by comparing the number of memory cells having threshold voltages in a first sampling threshold voltage section determined by the first optimum read voltage and a read voltage lower by K than the first optimum read voltage, and the number of memory cells having threshold voltages in a second sampling threshold voltage section determined by the first optimum read voltage and a read voltage higher by K than the first optimum read voltage.

6. The memory system according to claim 5, wherein, when the number of memory cells having threshold voltages in the first sampling threshold voltage section is larger than the number of memory cells having threshold voltages in the second sampling threshold voltage section, the memory controller determines the size of each of the first threshold voltage sections to be larger than the size of each of the second threshold voltage sections.

7. The memory system according to claim 1, wherein, in the case where at least one optimum read voltage lower than the first optimum read voltage and at least one optimum read voltage higher than the first optimum read voltage exist among the one or more optimum read voltages, the memory controller determines the size of the first threshold voltage sections and the size of the second threshold voltage sections, by comparing an offset between the first optimum read voltage and a third optimum read voltage which is a highest of optimum read voltages lower than the first optimum read voltage and comparing an offset between the first optimum read voltage and a fourth optimum read voltage which is a lowest of optimum read voltages higher than the first optimum read voltage.

8. The memory system according to claim 7, wherein, in the case where the offset between the first optimum read voltage and the third optimum read voltage is smaller than the offset between the first optimum read voltage and the fourth optimum read voltage, the memory controller determines the size of each of the first threshold voltage sections to be larger than the size of each of the second threshold voltage sections.

9. The memory system according to claim 1,
wherein the memory controller determines the size of each of the first threshold voltage sections and the size of each of the second threshold voltage sections, by comparing an offset between the first optimum read voltage and an average threshold voltage of a first threshold voltage distribution and an offset between the first optimum read voltage and an average threshold voltage of a second threshold voltage distribution,
wherein the first threshold voltage distribution and the second threshold voltage distribution are adjacent to the first optimum read voltage, and
wherein the average threshold voltage of the second threshold voltage distribution is higher than the average threshold voltage of the first threshold voltage distribution.

10. The memory system according to claim 9, wherein, in the case where the offset between the first optimum read voltage and the average threshold voltage of the first threshold voltage distribution is smaller than the offset between the first optimum read voltage and the average threshold voltage of the second threshold voltage distribution, the memory controller determines the size of the first threshold voltage sections to be larger than the size of the second threshold voltage sections.

11. A memory controller comprising:
a memory interface configured to communicate with a memory device comprising a plurality of memory cells; and
a control circuit configured to control the memory device,
wherein the control circuit is further configured to perform soft-decision decoding for data read from some among the plurality of memory cells based on a first optimum read voltage which is one among one or more optimum read voltages, based on reliability values of one or more first threshold voltage sections and one or more second threshold voltage sections and also based on the first and second threshold voltage sections,
wherein the one or more first threshold voltage sections are determined by read voltages which are lower than the first optimum read voltage, and the one or more second threshold voltage sections are determined by read voltages, which are higher than the first optimum read voltage,
wherein the control circuit is further configured to determine a size of the one or more first threshold voltage sections to be different than a size of the one or more second threshold voltage sections, and
wherein the size of two or more of the first threshold voltage sections is the same, and the size of two or more of the second threshold voltage sections is the same.

12. The memory controller according to claim 11,
wherein the size of each of the first threshold voltage sections is the same, and wherein the size of each of the second threshold voltage sections is the same.

13. The memory controller according to claim 11,
wherein, when the first optimum read voltage is a lowest of the one or more optimum read voltages, the control circuit determines the size of each of the first threshold voltage sections and the size of each of the second threshold voltage sections based on the first optimum read voltage and a second optimum read voltage, and
wherein the second optimum read voltage is an optimum read voltage having a minimum difference from the first optimum read voltage among the one or more optimum read voltages.

14. The memory controller according to claim 11, wherein, when the first optimum read voltage is a highest of the one or more optimum read voltages, the control circuit determines the size of each of the first threshold voltage sections and the size of each of the second threshold voltage sections, by comparing the number of memory cells having threshold voltages in a first sampling threshold voltage section determined by the first optimum read voltage and a read voltage lower by K than the first optimum read voltage, and the number of memory cells having threshold voltages in a second sampling threshold voltage section determined by the first optimum read voltage and a read voltage higher by K than the first optimum read voltage.

15. The memory controller according to claim 11, wherein, in the case where at least one optimum read voltage lower than the first optimum read voltage and at least one optimum read voltage higher than the first optimum read voltage exist among the one or more optimum read voltages, the control circuit determines the size of each of the first threshold voltage sections and the size of each of the second threshold voltage sections, by comparing an offset between the first optimum read voltage and a third optimum read voltage which is a highest of optimum read voltages lower than the first optimum read voltage and comparing an offset between the first optimum read voltage and a fourth optimum read voltage which is a lowest of optimum read voltages higher than the first optimum read voltage.

16. A method for operating a memory system comprising a memory device comprising a plurality of memory cells and a memory controller configured to control the memory device, the method comprising:
reading data from some among the plurality of memory cells based on a first optimum read voltage which is one among one or more optimum read voltages; and
performing soft-decision decoding, based on reliability values of one or more first threshold voltage sections and one or more second threshold voltage sections and also based on the first and second threshold voltage sections,
wherein the one or more first threshold voltage sections are determined by read voltages, which are lower than the first optimum read voltage, and the one or more second threshold voltage sections are determined by read voltages, which are higher than the first optimum read voltage, and
further comprising determining a size of the one or more first threshold voltage sections to be different than a size of the one or more second threshold voltage sections,
wherein the size of two or more of the first threshold voltage sections is the same, and the size of two or more of the second threshold voltage sections is the same.

17. The method according to claim 16,
wherein the size of each of the first threshold voltage sections is the same, and
wherein the size of each of the second threshold voltage sections is the same.

18. The method according to claim 16,
wherein, when the first optimum read voltage is a lowest of the one or more optimum read voltages, the size of each of the first threshold voltage sections and the size of each of the second threshold voltage sections is determined based on the first optimum read voltage and a second optimum read voltage, and
wherein the second optimum read voltage is an optimum read voltage having a minimum difference from the first optimum read voltage among the one or more optimum read voltages.

19. The method according to claim 16, wherein, when the first optimum read voltage is a highest of the one or more optimum read voltages, the size of each of the first threshold voltage sections and the size of each of the second threshold voltage sections is determined by comparing the number of memory cells having threshold voltages in a first sampling threshold voltage section determined by the first optimum read voltage and a read voltage lower by K than the first optimum read voltage, and the number of memory cells having threshold voltages in a second sampling threshold voltage section determined by the first optimum read voltage and a read voltage higher by K than the first optimum read voltage.

20. The method according to claim 16, wherein, in the case where at least one optimum read voltage lower than the first optimum read voltage and at least one optimum read voltage higher than the first optimum read voltage exist among the one or more optimum read voltages, the size of each of the first threshold voltage sections and the size of each of the second threshold voltage sections is determined by comparing an offset between the first optimum read voltage and a third optimum read voltage which is a highest of optimum read voltages lower than the first optimum read voltage and comparing an offset between the first optimum read voltage and a fourth optimum read voltage which is a lowest of optimum read voltages higher than the first optimum read voltage.

* * * * *